(12) United States Patent
Ahn et al.

(10) Patent No.: US 11,859,309 B2
(45) Date of Patent: Jan. 2, 2024

(54) CHEMICAL-VAPOR-DEPOSITION SILICON CARBIDE BULK HAVING IMPROVED ETCHING CHARACTERISTIC

(71) Applicant: DS TECHNO CO., LTD., Gwangju-si (KR)

(72) Inventors: Hak Jun Ahn, Seongnam-si (KR); Young Ju Kim, Wonju-si (KR); Youn Woong Jung, Wonju-si (KR); Kang Suk Kim, Cheongju-si (KR); Jun Baek Song, Wonju-si (KR); Won Geun Son, Wonju-si (KR)

(73) Assignee: DS TECHNO CO., LTD., Gwangju-si (KR)

( * ) Notice: Subject to any disclaimer, the term of this patent is extended or adjusted under 35 U.S.C. 154(b) by 1114 days.

(21) Appl. No.: 16/479,551

(22) PCT Filed: May 22, 2019

(86) PCT No.: PCT/KR2019/006141
§ 371 (c)(1),
(2) Date: Jul. 19, 2019

(87) PCT Pub. No.: WO2019/231164
PCT Pub. Date: Dec. 5, 2019

(65) Prior Publication Data
US 2021/0355603 A1 Nov. 18, 2021

(30) Foreign Application Priority Data

Jun. 1, 2018  (KR) .................. 10-2018-0063247
Nov. 29, 2018 (KR) .................. 10-2018-0151142

(51) Int. Cl.
*C30B 29/36* (2006.01)
*C23C 16/32* (2006.01)
(Continued)

(52) U.S. Cl.
CPC ............ *C30B 29/36* (2013.01); *C01B 32/977* (2017.08); *C23C 16/325* (2013.01); *C30B 25/02* (203.01); *H01L 21/0262* (2013.01);
*H01L 21/02529* (2013.01); *C01B 32/956* (2017.08); *H01L 21/02274* (2013.01)

(58) Field of Classification Search
CPC ... C01B 32/956; C01B 32/977; C23C 16/325; C23C 16/4412; C23C 16/4482;
(Continued)

(56) References Cited

U.S. PATENT DOCUMENTS 4,772,498 A    9/1988  Bertin et al. .................... 428/36
7,927,915 B2   4/2011  Goela et al. .................. 438/105
(Continued)

FOREIGN PATENT DOCUMENTS

JP    2001-107239 A    4/2001
JP     3199377 B2      8/2001
(Continued)

OTHER PUBLICATIONS

S.J. Vlaskina et al., Semiconductor Physics, Quantum Electronics & Optoelectronics, 2011. vol. 14, No. 4. pp. 432-436.
(Continued)

Primary Examiner — Matthew J Song
(74) Attorney, Agent, or Firm — Stein IP, LLC

(57) ABSTRACT

In the present invention, a chemical-vapor-deposition silicon carbide (SIC) bulk having an improved etching characteristic includes silicon carbide (SIC) manufactured by a chemical vapor deposition method using MTS (methyltrichlorosilane), hydrogen ($H_2$), and nitrogen ($N_2$) gases. The SIC manufactured by the chemical vapor deposition method is β-SiC (3C-SiC), and 6H-SiC is present in the SIC manufactured by the chemical vapor deposition method. Five peaks having a reference code of 03-065-0360 and a peak having a reference code of 00-049-1428 are confirmed to be present from XRD analysis of the silicon carbide bulk, and a nitrogen concentration value is $4.0 \times 10^{18}$ atoms/cm$^3$ or more at a depth of 1,500 nm or more from the surface of the bulk, which is a metastable layer.

3 Claims, 23 Drawing Sheets

(51) Int. Cl.
*C30B 25/02* (2006.01)
*H01L 21/02* (2006.01)
*C01B 32/977* (2017.01)
*C01B 32/956* (2017.01)

(58) Field of Classification Search
CPC ........ C23C 16/45512; C23C 16/45561; C23C 16/45574; C23C 16/45576; C23C 16/45578; C23C 16/56; C30B 25/02; C30B 25/165; C30B 29/36; C30B 33/12; H01J 37/32642; H01L 21/02; H01L 21/02167; H01L 21/02211; H01L 21/02274; H01L 21/02529; H01L 21/02576; H01L 21/0262; H01L 21/3065; H01L 21/687
See application file for complete search history.

(56) References Cited

U.S. PATENT DOCUMENTS

2009/0038541 A1* 2/2009 Robbins .................. C30B 25/00
117/88

2014/0283736 A1* 9/2014 Nishio .................... C30B 25/14
118/712

FOREIGN PATENT DOCUMENTS

| | | |
|---|---|---|
| JP | 2002-47066 A | 2/2002 |
| JP | 2015-000836 A | 1/2015 |
| KR | 10-2001-0051465 A | 6/2001 |
| KR | 10-2001-0085556 A | 9/2001 |
| KR | 10-2002-0011860 A | 2/2002 |
| KR | 10-2007-0026342 A | 3/2007 |
| KR | 10-2007-0038346 A | 4/2007 |
| KR | 10-2011-0026969 A | 3/2011 |
| KR | 10-1628691 B1 | 6/2016 |
| KR | 10-2016-0097149 A | 8/2016 |
| WO | WO 2017/038555 A1 | 3/2017 |

OTHER PUBLICATIONS

Lu Li et al., "Periodically twinned 6H—SiC nanowires with fluctuating stems", Sep. 3, 2013, Ceramics International 40, pp. 4455-4460.

* cited by examiner

CHEMICAL-VAPOR-DEPOSITION SILICON CARBIDE BULK HAVING IMPROVED ETCHING CHARACTERISTIC

CROSS-REFERENCE TO RELATED APPLICATIONS

This application is a national stage of International Application No. PCT/KR2019/006141, filed May 22, 2019, which claims the benefit of priority to Korean Application No. 10-2018-0063247, filed Jun. 1, 2018, and Korean Application No. 10-2018-0151142, filed Nov. 29, 2018 in the Korean Intellectual Property Office, the disclosures of which are incorporated herein by reference.

TECHNICAL FIELD

The present invention relates to a chemical-vapor-deposition (CVD) silicon carbide bulk, and to a silicon carbide bulk which has a uniform nitrogen concentration and a uniform resistance value therein and which contains 6H-SiC to thus have further improved etching characteristics.

BACKGROUND ART

In general, in the case of silicon carbide, silicon carbide parts used during semiconductor and LED processes are used in wafer carriers called susceptors, boats and tubes for deposition processes, and rings and shower plates used during etching processes.

In particular, due to the tremendous growth of the semiconductor industry, suppliers of components used in the manufacture of silicon integrated circuits (IC) have had to improve their products in order to increase IC productivity without increasing costs. One example of the need for such improvement is to increase the wear lifespan of capillaries or weld tip guides used in wire-ball-bonding operations in IC manufacturing processes and to improve the performance of various tools containing silicon carbide.

Meanwhile, an attempt to reduce the resistivity of a CVD-SiC molded body and thus apply the same as a heater has been previously disclosed. For example, there is disclosed a heater obtained by introducing nitrogen gas at a flow rate of 0.4 L/min into methyltrichlorosilane (MTS), which is a raw material, at 40° C. and enabling a SiC(N) layer having a SiC(N)/TiN/SiC structure to grow to a thickness of 0.44 μm at a hydrogen flow rate of 2.0 L/min at a deposition temperature of 1400° C. under 1 atm. It is disclosed that the resistivity is further lowered when the flow rate of nitrogen gas is 0.5 L/min. However, since it is difficult to freely control the ratio between the concentration of MTS, which is a raw material, and the concentration of nitrogen gas, pores are easily generated therein. Accordingly, it is difficult to obtain CVD-SiC which is dense and gas-impermeable.

Further, a method of obtaining a nitrogen-doped CVD-SiC molded body by controlling the amount of nitrogen gas introduced together with a raw-material gas is disclosed. In the method, a silicon monocrystalline substrate is heated to 900 to 1200° C., monosilane (SiH4) gas and propane gas are used as raw-material gases, and hydrogen gas is used as carrier gas. After a very thin SiC film is formed on a substrate, the temperature of the substrate is raised to 1300 to 1400° C., and nitrogen gas ($1 \times 10^{-2}$ to 1 cc/min, the concentration of the nitrogen gas being $1 \times 10^{-2}$ to 1 (cc/min)/0.05 to 0.3 (cc/min)=0.01/0.1 to 1/0.6=10 to 167 vol % based on the raw-material gases) is introduced as a dopant while the raw-material gases (0.05 to 0.3 cc/min) are introduced, thus enabling an n-type 3C-style SiC monocrystalline thin film to grow on a substrate. A thin film of 0.5 to 3 μm is obtained after growing for 1 hour.

Further, currently, a semiconductor-manufacturing apparatus, particularly a focus ring, which is exposed to acidic materials and etching materials, requires a further improved etching characteristic and improved uniformity of resistance or nitrogen concentration therein.

Korean Laid-Open Patent Application No. 10-2007-0038346 provides "a focus ring of a semiconductor-manufacturing device, the focus ring having a generally annular shape so as to be arranged on the outer periphery of a wafer, the focus ring comprising a part in which a plurality of projections having a predetermined shape is arranged in a group to thus form a surface area larger than that of other parts and the plurality of projections is regularly or irregularly arranged".

Korean Laid-Open Patent Application No. 10-2001-0051465 provides "a silicon focus ring including a silicon monocrystal used as a focus ring in a plasma device, wherein the interstitial oxygen concentration in the silicon focus ring ranges from $5 \times 10^{17}$ atoms/cm$^3$ to $1.5 \times 10^{18}$ atoms/cm$^3$ and the nitrogen concentration therein ranges from $5 \times 10^{13}$ atoms/cm$^3$ to $5 \times 10^{15}$ atoms/cm$^3$".

However, the above-mentioned prior art patent does not show a method of further improving the etching characteristic in the focus ring and does not show the inner structure and characteristics of grains in the focus ring having the improved etching characteristic.

Therefore, there is an urgent need to develop a focus ring that has an improved etching characteristic and is capable of being used in ultra-fine processing and being manufactured at low cost.

[Prior Art Document]
Korean Laid-Open Patent Application No. 10-2007-0038346 (Apr. 10, 2007)
Korean Laid-Open Patent Application No. 10-2001-0051465 (Jun. 25, 2001)

DISCLOSURE

Technical Problem

Accordingly, the present invention has been made keeping in mind the above problems occurring in the related art, and an object of the present invention is to provide a silicon carbide bulk, obtained by optimizing the supply and mixing techniques of nitrogen gas while manufacturing SiC for the manufacture of a chemical-vapor-deposition (CVD) silicon carbide bulk. The silicon carbide bulk has improved etching characteristics, has a uniform nitrogen concentration and resistance value so as to be usable in ultra-fine processing, and is capable of being manufactured at low cost.

Technical Solution

In order to accomplish the above object, the present invention provides a chemical-vapor-deposition silicon carbide (SIC) bulk having an improved etching characteristic, including silicon carbide (SIC) manufactured by a chemical vapor deposition method using MTS (methyltrichlorosilane), hydrogen (H$_2$), and nitrogen (N$_2$) gases. The SIC manufactured by the chemical vapor deposition method is β-SiC (3C-SiC), and 6H-SiC is present in the SIC manufactured by the chemical vapor deposition method. Five peaks having a reference code of 03-065-0360 and a peak having a reference code of 00-049-1428 are confirmed to be present from XRD analysis of the silicon carbide bulk, and a nitrogen concentration value is $4.0 \times 10^{18}$ atoms/cm$^3$ or more at a depth of 1,500 nm or more from the surface of the bulk, which is a metastable layer.

Comb patterns are formed in grains of the carbide bulk, and the area ratio of comb patterns in the grains of the bulk is 50% or more.

In addition, the present invention provides a chemical-vapor-deposition silicon carbide (SIC) bulk having an improved etching characteristic, including silicon carbide (SIC) manufactured by a chemical vapor deposition method using MIS (methyltrichlorosilane), hydrogen ($H_2$), and nitrogen ($N_2$) gases. The SIC manufactured by the chemical vapor deposition method is β-SiC (3C-SiC), and 6H-SiC is present in the SIC manufactured by the chemical vapor deposition method. Five peaks having a reference code of 03-065-0360 and a peak having a reference code of 00-049-1428 are confirmed to be present from XRD analysis of the silicon carbide bulk, and a nitrogen concentration value is $4.0 \times 10^{19}$ atoms/cm$^3$ or more at a depth of 1,500 nm or more from the surface of the bulk, which is a metastable layer.

The amount of trace elements is 5 ppm or less, and the bending strength is 350 to 650 MPa.

Further, the present invention provides a chemical-vapor-deposition silicon carbide (SIC) bulk having an improved etching characteristic, including silicon carbide (SIC) manufactured by a chemical vapor deposition method using MTS (methyltrichlorosilane), hydrogen ($H_2$), and nitrogen ($N_2$) gases. The SIC manufactured by the chemical vapor deposition method is β-SiC (3C-SiC), and 6H-SiC is present in the SIC manufactured by the chemical vapor deposition method. Five peaks having a reference code of 03-065-0360 and a peak having a reference code of 00-049-1428 are confirmed to be present from XRD analysis of the silicon carbide bulk, and the resistance value of the silicon carbide is 0.3 Ω or less or 0.003 Ω or less.

Grains are present in the carbide bulk, comb patterns are formed in the grains, and the average grain size is about 40 to 100 μm.

Further, the present invention provides a chemical-vapor-deposition silicon carbide (SIC) bulk having an improved etching characteristic, including silicon carbide (SIC) manufactured by a chemical vapor deposition method using MTS (methyltrichlorosilane), hydrogen ($H_2$), and nitrogen ($N_2$) gases. The SIC manufactured by the chemical vapor deposition method is βSiC (3C-SiC), and 6H-SiC is present in the SIC manufactured by the chemical vapor deposition method. Five peaks having a reference code of 03-065-0360 and a peak having a reference code of 00-049-1428 are confirmed to be present from XRD analysis of the silicon carbide bulk, and the resistance value of the silicon carbide is 1 Ω or less.

An average grain size is about 40 to 100 μm when crystal grains are generated.

Meanwhile, silicon carbide (SIC) is manufactured by a chemical vapor deposition method using MTS (methyltrichlorosilane), hydrogen ($H_2$), and nitrogen ($N_2$) gases. The SIC manufactured by the chemical vapor deposition method is β-SiC (3C-SiC), and the silicon carbide (SIC) generated by the chemical vapor deposition method forms 6H-SiC through a phase-transition process. When the number of SIC layers manufactured by the chemical vapor deposition method is two or more, the characteristics depend on the layers. The resistance value of the first layer is different from the resistance value of the second layer when the number of SIC layers is two, the nitrogen concentration value of the first layer is different from the nitrogen concentration value of the second layer when the number of SIC layers is two, and the thermal conductivity of the first layer is different from the thermal conductivity of the second layer when the number of SIC layers is two.

The SIC is manufactured in the form of a specimen having a thickness ranging from 5 mm to 15 mm, a yellow wavelength is transmitted therethrough when white LED light is radiated, the first layer and the second layer have different flexural strengths, the first layer and the second layer are different from each other in height of a 6H-SiC peak, an impurity concentration is uniform in the first layer and the second layer, and a visible-ray wavelength value of the first layer is different from a visible-ray wavelength value of the second layer.

Advantageous Effects

According to the present invention, it is possible to provide SiC which has an improved etching characteristic to thus improve a yield in a semiconductor process and which reduces costs due to an increase in usable period thereof It is also possible to provide SiC which has a greatly improved resistance value and uniformity of nitrogen concentration, thus being usable in ultra-fine processing.

Figure 1:
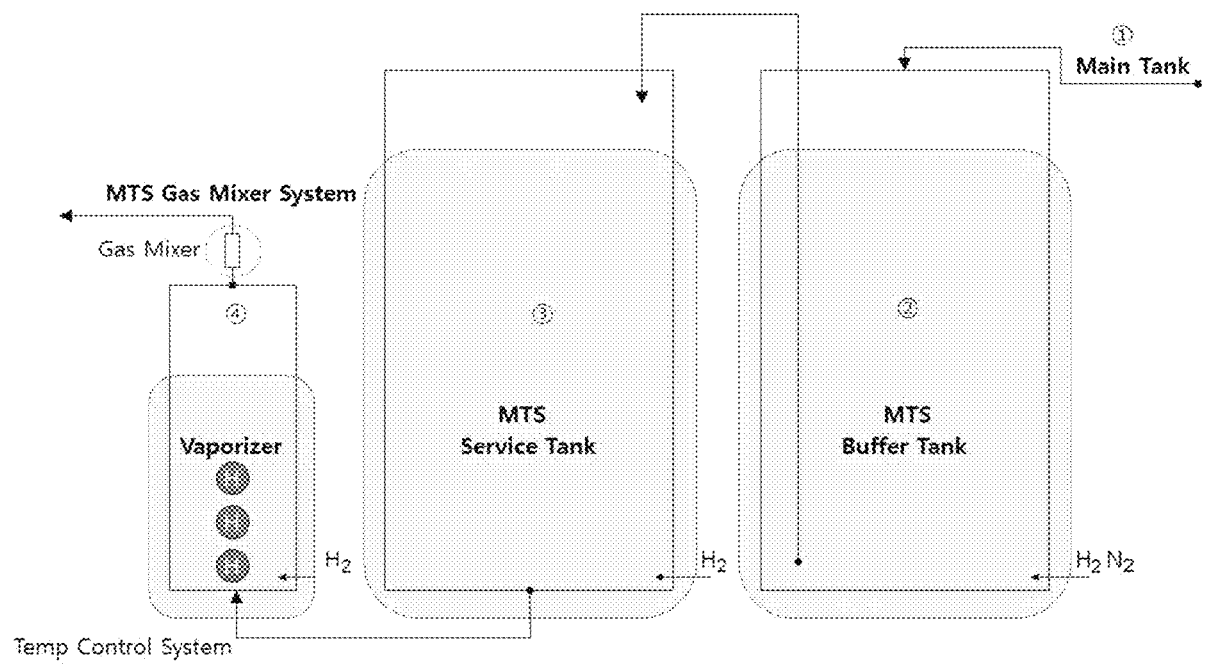
FIG. 1 is a view of an embodiment showing a process chart for transporting MTS and mixing used gases in the present invention.

| <Description of Reference Numerals in the Drawings> | |
|---|---|
| 10: Header | 20: Spray line |
| 31: Supply tube | 32: Nozzle |
| 30: Sanitary fastening | 40: Deposition furnace |
| 50: Scrubber | 100: Focus ring |

BEST MODE

Hereinafter, a focus ring used in a semiconductor-manufacturing apparatus having an improved etching characteristic according to an embodiment of the present invention will be described in detail.

The detailed description of common techniques necessary for explaining the present invention may be omitted.

First, a conventional general chemical vapor deposition method will be described as follows.

In the silicon carbide production operation by the chemical vapor deposition method, a silicon carbide precursor gas such as a mixture of methyltrichlorosilane (MTS), hydrogen, and argon is supplied to a deposition chamber and is then heated to the temperature at which silicon carbide is manufactured using reactions. Silicon carbide is deposited as a film or a shell on a solid mandrel provided in the deposition chamber. After silicon carbide having a desired thickness is deposited on the mandrel, the coated mandrel is removed from the deposition chamber and the deposit is separated from the mandrel. Monolithic silicon carbide plates and cylinders have been produced by applying such chemical vapor deposition (CVD) techniques using substrates having suitable shapes or mandrel shapes.

Accordingly, the present invention provides a method of producing silicon carbide by a chemical vapor deposition (CVD) method, and in particular, a method of producing silicon carbide having an improved etching characteristic.

Meanwhile, the physicochemical characteristics of the silicon carbide manufactured by the above-described manufacturing method of the present invention are analyzed for use in a semiconductor process.

A chemical vapor deposition (CVD) system is used to produce silicon carbide products. In addition, methyltrichlorosilane (MTS) is provided, and argon is used as a carrier gas for MTS. In addition, argon is supplied together with the floating MTS in a sealed state, and is then mixed with hydrogen and nitrogen ($N_2$).

In addition, the mixed precursor gases are supplied to a deposition furnace through a sprayer. In addition, dissociation of the MTS and silicon carbide deposits is caused, and exhaust gases generated in a dissociation reaction are discharged.

Meanwhile, a silicon carbide precursor is selected from among materials capable of reacting to form silicon carbide. These materials generally include a component capable of reacting to form a silicon moiety such as silane or chlorosilane and a component capable of reacting to form a carbon moiety such as hydrocarbons. Hydrocarbon-substituted silanes are preferred silicon carbide precursors, and this is because the silanes contain silicon and carbon moieties within a single compound.

Moreover, inert and non-reactive gases such as argon, helium, or other inert gases may be used as carriers for precursors of normal liquids (e.g., liquids at typical STP). In particular, methyltrichlorosilane (MTS) is a preferred precursor when used together with hydrogen ($H_2$) for removing chlorine that is released while MTS is dissociated. For MTS (which is liquid at room temperature), argon is generally used as an inert and non-reactive carrier gas. Argon acts as a diluent.

Further, a conventional general focus ring and a method of manufacturing the focus ring will be described as follows.

A focus ring of a semiconductor-manufacturing device serves to improve the etching uniformity of a wafer. Plasma-based devices are frequently used to form a thin film on a silicon wafer or to perform etching in the manufacture of semiconductor devices. In a plasma-etching device, among the above-described devices, a silicon wafer to be treated is disposed on a lower electrode, a reactive gas is introduced from an upper electrode, and a high-frequency voltage is applied to both electrodes, which generates high-frequency plasma between the two electrodes to thus etch the silicon wafer.

In such a plasma device, it is necessary to make the plasma supplied to the silicon wafer uniform. For this reason, conventionally, a focus ring is disposed around the wafer, thereby enlarging the plasma to the outside of the wafer and improving the uniformity of the plasma on the wafer. The silicon wafer is disposed in the inner region of the focus ring. The focus ring generally includes the same material as the silicon wafer, that is, silicon.

Meanwhile, the method of manufacturing the focus ring will be described as follows.

The focus ring of the present invention is manufactured by processing silicon carbide manufactured by the chemical vapor deposition method. That is, a typical method of manufacturing a focus ring of a dry-etching device includes the steps of: preparing a graphite disk having a diameter larger than the diameter of a semiconductor wafer; depositing SiC on the entire surface of the graphite disk to form a SiC layer; vertically cutting the SiC layer so as to have a circular shape and expose the edges of the graphite disk (S13); cutting a structure, in which the SiC layer is layered on the upper and lower surfaces of the graphite disk having the exposed lateral surface, among the substances resulting from the step of vertically cutting the SiC layer so as to have the circular shape, so that the central portion of the graphite disk is cut in a transverse direction, thereby obtaining two structures in which the SiC layer is layered on one surface of the graphite disk; removing the graphite disk from the substances resulting from the step of vertically cutting the SiC layer so as to have the circular shape, thus obtaining two disk-type SiC layers; and vertically cutting the two disk-type SiC layers so as to have the circular shape, thus simultaneously manufacturing a dummy wafer and a focus ring.

FIG. 1 is a view of an embodiment showing a process chart for transporting MTS and mixing used gases in the present invention.

The steps of the process chart are as follows: the following is an initial step of mixing gases in the pre-deposition-furnace step.

1) The MTS (methyltrichlorosilane) is transported from a main tank where the MTS is stored to a buffer tank. Hydrogen ($H_2$) gas and nitrogen ($N_2$) gas are supplied together.

For reference, the buffer tank is a tank having a function of supplying a predetermined amount of content, and a device having a function of supplying a predetermined amount of content is added thereto.

2) The MIS present in the buffer tank is transported to a service tank. Hydrogen ($H_2$) gas is supplied thereto together with the MTS. The service tank is a tank having a transportation function of directly supporting the MTS to a vaporizer.

3) The MTS is supplied from the service tank to the vaporizer, and the MTS is vaporized in the vaporizer. The vaporized MTS is supplied to a gas-mixing system line together with nitrogen and hydrogen gases. Hydrogen is continuously supplied to the vaporizer.

With respect thereto, all of the processes are performed while being controlled at a set temperature. As a result, a constant supply of MTS is possible, and uniform mixing of hydrogen and nitrogen is induced.

That is, with respect to a method of supplying MTS to a conventional deposition device, a single-stage mixing system is used in which the MTS located in a thermostat is supplied through a line and in which argon, nitrogen, and hydrogen are directly supplied to the MTS supply line. However, in the present invention, a buffer tank and a service tank are disposed at an intermediate position between the MTS supply unit and the deposition device, and the MIS is set so as to pass through a vaporizer after passing through the tanks.

Figure 2:
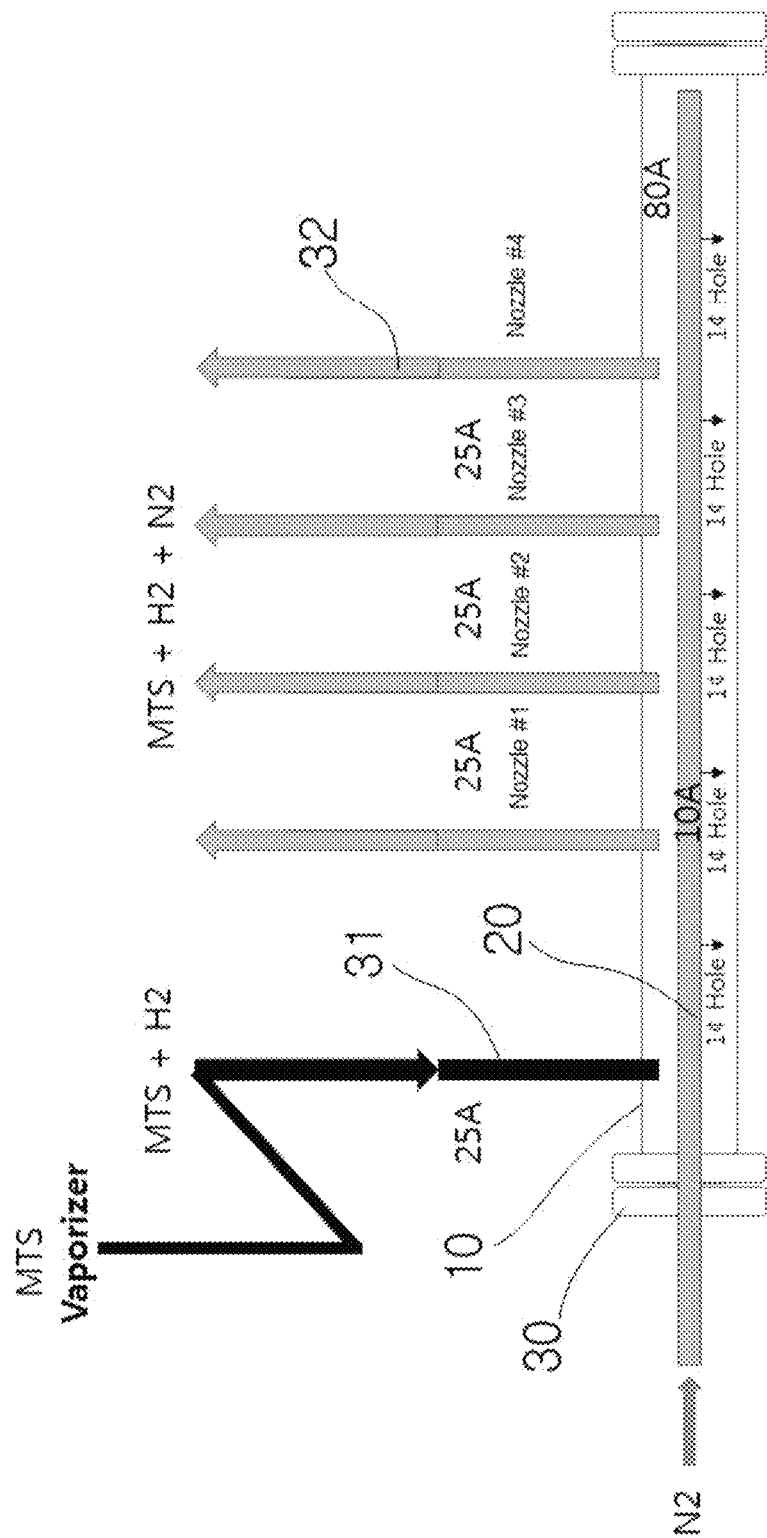
FIG. 2 is a view of an embodiment showing a gas-mixing system line.

FIG. 2 is a view of an embodiment showing a gas-mixing system line for spraying into a deposition furnace.

The gas-mixing system of the present invention includes a header 10 and a spray line 20.

The header 10 is an outer tube surrounding the spray line 20, and the diameter of the header 10 used in the present invention is 80 mm. In addition, the diameter of the spray line 20 provided in the header used in the present invention is 10 mm. The header is sanitary-fastened 30 using sanitary parts, and is made to withstand pressure and to secure a high sealing effect.

The MTS supplied from a vaporizer, nitrogen, and hydrogen are supplied through a supply tube 31 to the inlet side of the header 10. In addition, the diameter of the supply tube 31 used in the present invention is 25 mm and the supply tube is connected to the front side of the header 10.

In addition, at least two nozzles 32 are connected to the header 10. As shown in the drawings, in an embodiment of the present invention, four nozzles 32 are used. The MTS, nitrogen, and hydrogen are sprayed onto a deposition furnace 40 from the respective nozzles 32. The diameter of the nozzle 32 used in the present invention is 25 mm.

Meanwhile, as shown in the drawings, nitrogen is supplied to the inlet side of the spray line 20 provided in the header 10, and a plurality of 1 mm holes are extensively formed all over the spray line.

Moreover, the values of the diameters of the header, the line, and the nozzle shown in the above-described embodiment are only examples, and the features of the present invention are not necessarily limited to the above-described diameter values.

Figure 3:
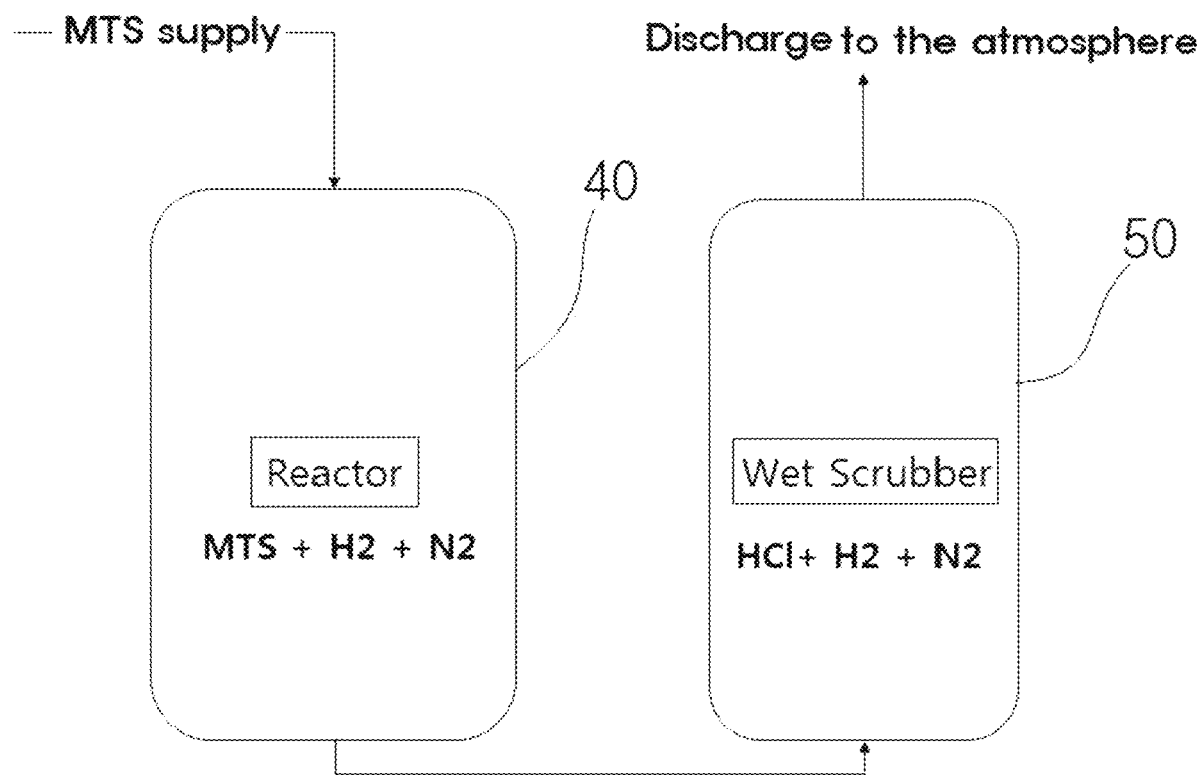
FIG. 3 is a simplified view showing a reactor and a scrubber.

FIG. 3 is a simplified view showing a reactor and a scrubber.

In FIG. 3, the reactor means a deposition furnace 40 in which a CVD process is performed. That is, SiC is deposited using the mixed gas sprayed from the spray line 20, thus manufacturing a deposit.

In addition, deposition is performed in the deposition furnace 40, and the exhaust gases generated during a dissociation reaction after the deposition are discharged through an exhaust port (a portion that is positioned at the lower end of the deposition furnace 40 and is connected to a scrubber 50 in the drawing).

The deposition furnace 40 is a water-cooled housing made of stainless steel. In this housing, a graphite mandrel, a graphite heating member, and a graphite insulating tube are provided. In addition, the mixed precursor gases introduced into the deposition furnace 40 pass over the inner surface of the heated graphite mandrel, thus causing dissociation of the deposit of MTS and silicon carbide on the inner surface of the mandrel.

From the exhaust gases discharged from the exhaust port of the deposition furnace 40, floating solid materials are removed through a filter, although this is not separately shown in the drawing. Thereafter, the exhaust gases pass through a vacuum pump for controlling the reduced pressure in the deposition furnace. In addition, the exhaust gases pass through a scrubber 50 for recovering required gases and are then discharged to the atmosphere.

Dopant Supply Amount

The present invention relates to a chemical-vapor-deposition (CVD) silicon carbide bulk and a method of manufacturing the same, and it is possible to manufacture SiC having low resistance by improving a gas-mixing system even when $N_2$ is added in an amount smaller than in a conventional method.

Tables 1 and 2 show the content of each component in the gas supplied to the deposition furnace 40. First, Table 1 shows the component content in the method by this company, and Table 2 shows the component content in the conventional technology (assuming that the sum of MTS and hydrogen is 100%).

When comparing Tables 1 and 2, it can be seen that, in the present invention, the supply gas contains nitrogen at a content of 0.00062% to 0.65% or at a content of 0.65% or higher in order to manufacture SiC (assuming that the sum of MTS and hydrogen is 100%). In Tables 1 and 2, 'SLPM' means 'standard liter per minute'.

However, conventionally, nitrogen needs to be present at a content of 10 to 60% in order to manufacture SiC (assuming that the sum of MTS and hydrogen is 100%).

As a result, in the present invention, the ratio of nitrogen gas may be greatly reduced.

TABLE 1

| Reagent | 0.3 Ω · cm | 0.1 | 0.008 | Note |
|---|---|---|---|---|
| H2/slpm | 185 | 185 | 185 | 92.5% |
| MTS/slpm | 15 | 15 | 15 | 7.5% |
| N2/slpm | 20 | 30 | 120 | |

TABLE 2

| Reagent | Normal resistance 1~15 Ω | Low resistance 0.1~1 Ω | Ultra-low resistance 0.001~1 Ω | Note |
|---|---|---|---|---|
| H2/slpm | 92 | 92 | 92 | 92% |
| MTS/slpm | 8 | 8 | 8 | 8% |
| N2/slpm | 0.005~0.0062 | 0.0062~0.65 | 0.65 or higher | |

Figure 4:
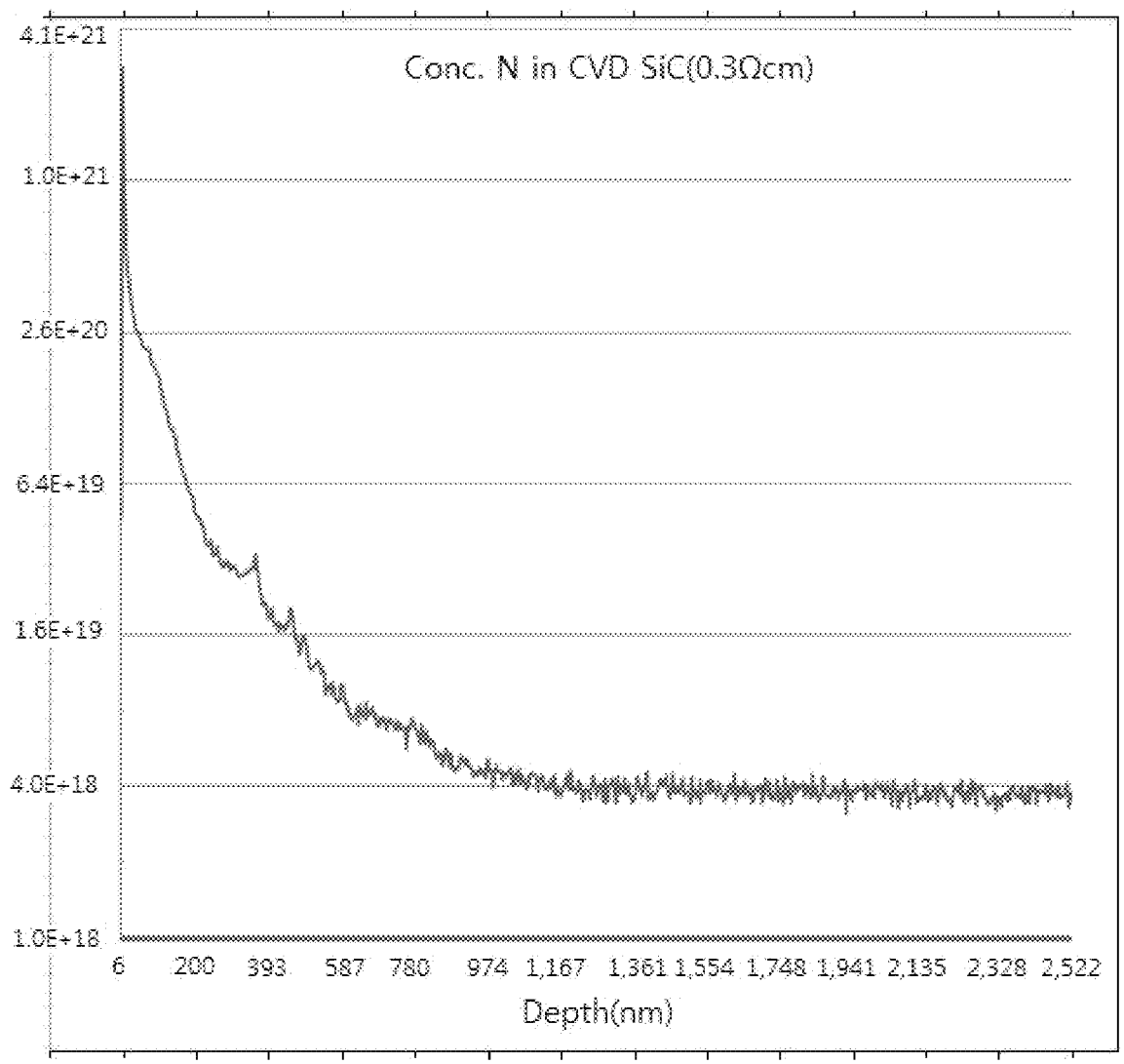
FIGS. 4 and 5 are views of embodiments showing the nitrogen concentration in SiC having a low resistance.
Figure 5:
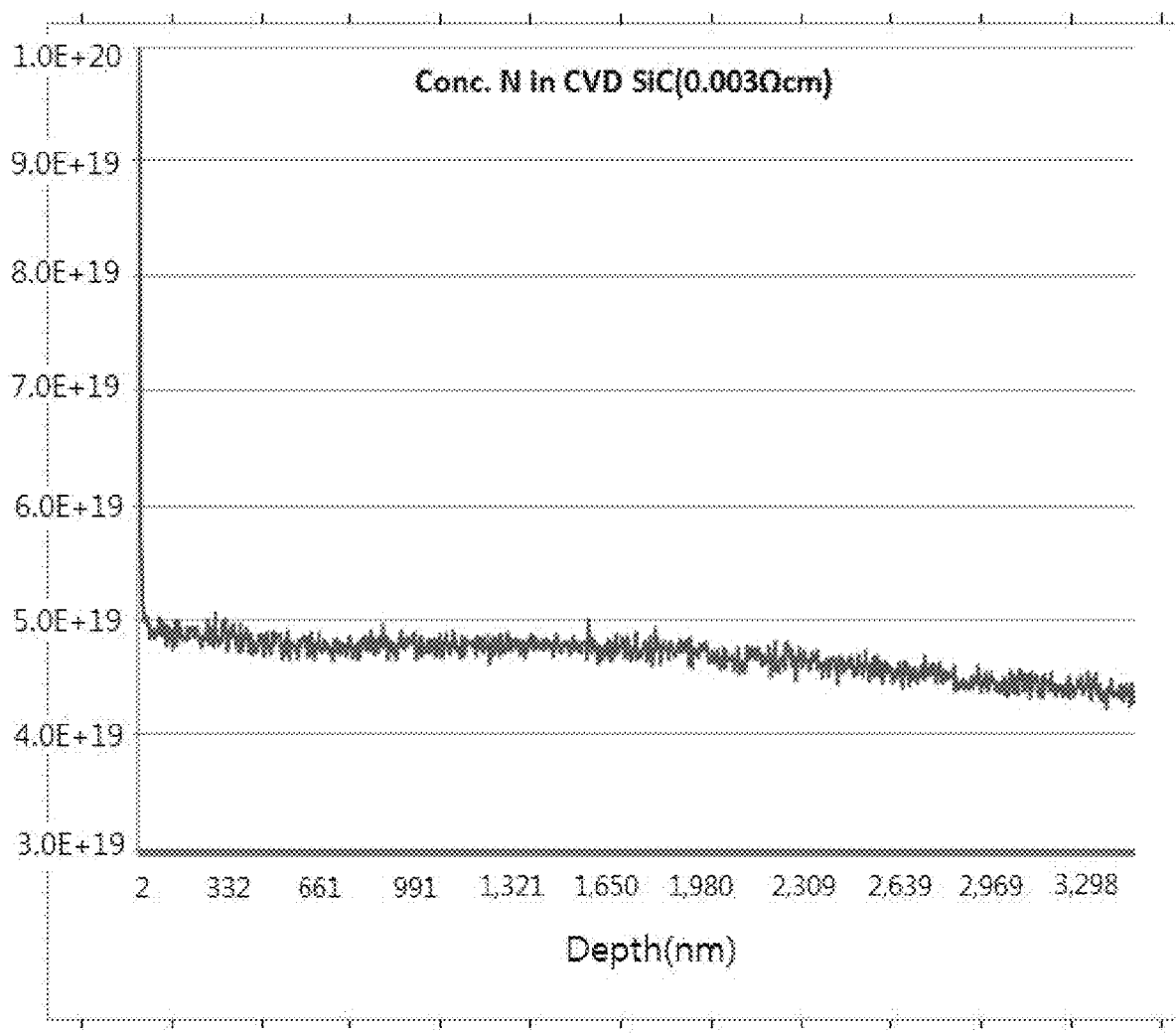

FIGS. 4 and 5 are views of embodiments showing the nitrogen concentration in the silicon carbide bulk manufactured according to the manufacturing process of the present invention using a chemical vapor deposition (CVD) method.

The nitrogen concentration value is shown at a depth of 1,500 nm or more (metastable layer) from the surface of the silicon carbide bulk. For this, specimens were analyzed using scanning ion mass spectroscopy. Further, for impurities of trace elements, gas discharge mass spectroscopy (GDMS) may be used to analyze the specimens.

FIG. 4 is a graph showing the measured value of the nitrogen concentration in the SiC having the low resistance of 0.3 Ω or less. As shown in FIG. 4, the nitrogen concentration is $4.0 \times 10^{18}$ atoms/cm$^3$ or more at a depth of 1,500 nm or more (metastable layer). Accordingly, it can be seen that the nitrogen concentration value is smaller than $1.0 \times 10^{19}$ atoms/cm$^3$, which is the nitrogen concentration value proposed in the conventional technology.

FIG. 5 is a graph showing the measured value of the nitrogen concentration in a new silicon carbide bulk which is currently used and which has a low resistance value of 0.003 Ω or less. In addition, the figure shows the nitrogen concentration value at a depth of 1,500 nm or more (metastable layer) from the surface of the silicon carbide bulk, and it can be seen that the nitrogen concentration is $4.0 \times 10^{19}$ atoms/cm$^3$ or more.

Figure 6:
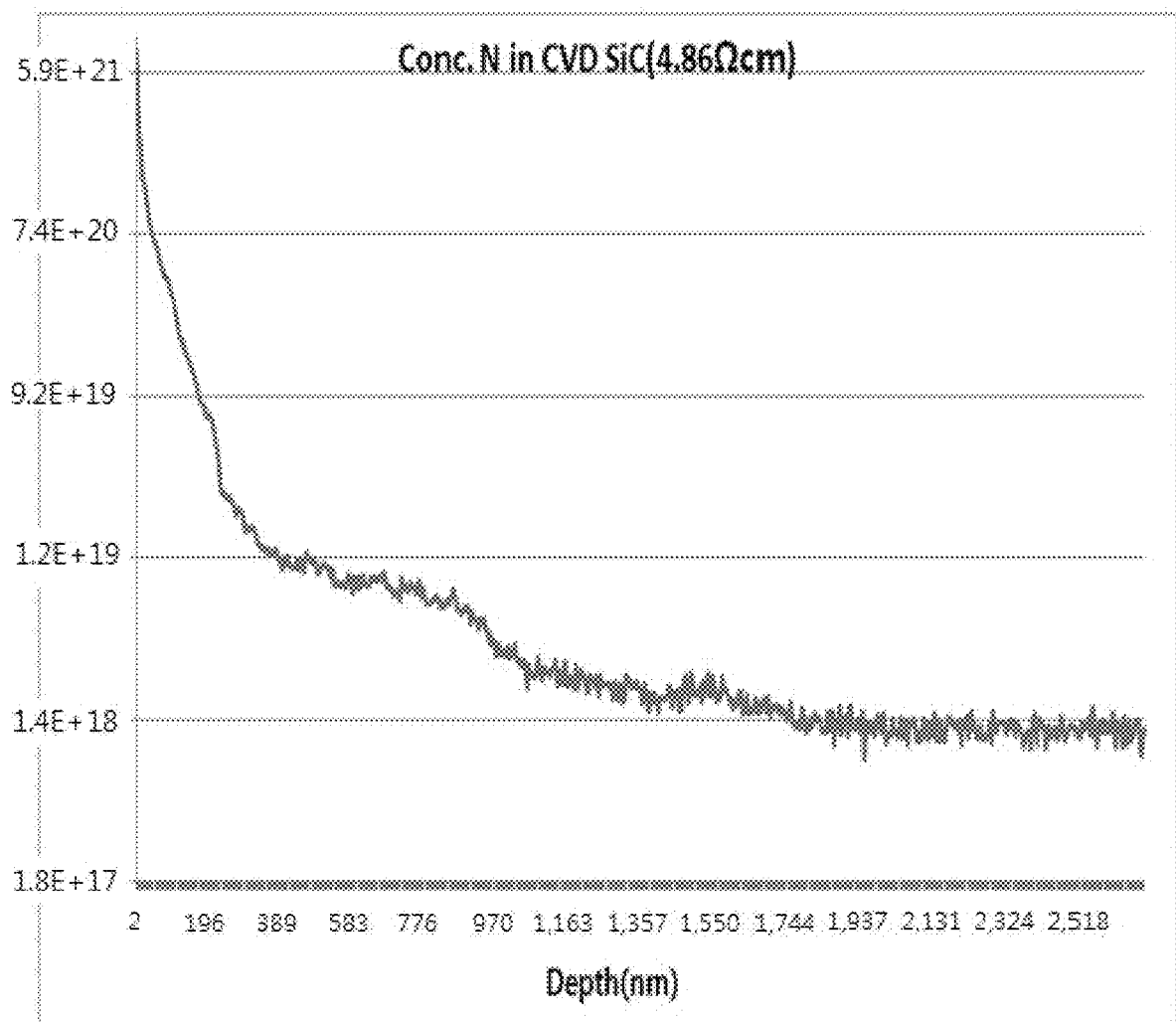
FIG. 6 is a view showing the nitrogen concentration in SiC having a normal resistance.

FIG. 6 is a view of an embodiment showing the nitrogen concentration in the silicon carbide bulk having a normal resistance manufactured using a chemical vapor deposition (CVD) method.

That is, FIG. 6 is a view showing the nitrogen concentration in SiC having a normal resistance value of 1 Ω·cm or more, and the concentration-measuring method is the same as that described in FIGS. 4 and 5.

From the drawings, it can be seen that the nitrogen concentration is $1.4 \times 10^{18}$ atoms/cm$^3$ or less around a depth of 1,500 nm or more (metastable layer) from the surface of the silicon carbide bulk.

Characteristics for each CVD-SiC Structure

Table 3 shows the characteristics for each CVD-SiC structure. 3C-SiC is included in β-SiC, which is a low-temperature stable phase, and 2H-SiC, 4H-SiC, and 6H-SiC are included in α-SiC, which is a high-temperature stable phase. In addition, the 3C-SiC, which is β-SiC, is silicon carbide manufactured at a temperature of 1500° C. or lower. Further, the 2H-SiC, 4H-SiC, and 6H-SiC, which are α-SiC, are silicon carbide manufactured at a high temperature of 1500° C. or higher.

Meanwhile, since α-SiC has an etching rate lower than that of β-SiC (high etch resistance), in the etching process, yield is improved, and the usable period thereof is increased, thereby reducing costs and increasing productivity.

However, since α-SiC must be manufactured through a high-temperature process, it is difficult to increase the size thereof, and mass productivity thereof is low, and therefore this is not a practical alternative.

TABLE 3

| Polytype characterization | 3C—SiC (β-SiC) | 2H—SiC (α-SiC) | 4H—SiC (α-SiC) | 6H—SiC (α-SiC) |
|---|---|---|---|---|
| Structural group | F43m | P6$_3$mc | P6$_3$mc | P6$_3$mc |
| Hexagonality(%) | 0 | 100 | 50 | 33 |
| Layer alternation (see FIG. 1) | ABC | AB | ABCB | ABCACB |
| Lattice spacing/nm | | | | |
| a | 0.43589-0.43596 | 0.30753-0.3081 | 0.3070-0.3081 | 0.3073-0.3081 |
| c | — | 0.5031-0.5048 | 1.0053-1.008 | 1.51092-1.512 |
| Tabulated values/nm | | | | |
| a | 0.4359 | 0.3079 | 0.3073 | 0.3080 |
| c | — | 0.5053 | 1.053 | 1.5117 |
| Density/g cm$^{-3}$ | 3.215 | 3.219 | 3.215 | 3.212 |
| Band gap/eV | 2.39 | 3.33 | 3.26 | 3.02 |
| Electron mobility at 300 K/cm$^2$ V$^1$ s$^1$ | ≤1000 | — | ≤850 | ≤450 |
| Hole mobility at 300 K/cm$^2$ V$^1$ s$^1$ | ≤40 | — | ≤120 | ≤100 |

Meanwhile, the paper "Angle etch control for silicon cabide power devices", (F. Lanois, P. Lassagne, Appl. Phys. Lett. 69(2), 8 Jul. 1996, France) reports that an etching rate of 6H-SiC is similar to that of 3C-SiC although the 6H-SiC is etched about 10% more slowly than the 3C-SiC because the density of a 6H-Si face is higher than that of a 3C-Si face. For reference, the 6H-Si face has $1.22 \times 10^{15}$ atoms/cm$^2$ and the 3C-Si face has $1.06 \times 10^{15}$ atoms/cm$^2$.

Further, the paper "Residue-Free Reactive Ion Etching of 3C-SiC and 6H-SiC in Fluorinated Mixture Plasmas" (P.H Yihm A. J. Steckl, J. Electrochem. Soc., Vol. 142, No. 8, August 1995, US) provides a technical explanation stating that the etch resistance of 6H-SiC is higher than that of 3C-SiC.

α-SiC Phase-Transition Process

In the present invention, the silicon carbide obtained through the embodiment of FIG. 3 is subjected to heat treatment. The heat-treatment process is performed through two steps. The first heat-treatment process is a process for surface high-refining (referred to as "D-clean" in the present invention), and the second heat-treatment process is a heat-treatment process for improving an etching characteristic (referred to as "H-clean").

The silicon carbide obtained through the embodiments of FIGS. 1 to 3 of the present invention is 3C-SiC, which is β-SiC. The 3C-SiC, that is, the β-SiC, is converted into 6H-SiC, which is α-SiC, through the phase-transition process.

(1) Surface High-Refining Heat-Treatment Process (D-Clean)

D-clean is a first-step heat-treatment process for silicon carbide obtained through the embodiment of FIG. 3. The processing conditions are set such that the silicon carbide is put into a heat-treatment oven and maintained at a temperature of 500 to 1500° C. for 30 minutes to 6 hours. The temperature and time may be adjusted according to the required process conditions. In addition, the optimum heat treatment conditions, obtained based on the results of repeated experimentation, include maintaining a temperature of 1100 to 1300° C. for 2 to 5 hours.

In addition, the heat-treatment oven is maintained under the atmospheric condition and atmospheric pressure condition, and water vapor (H$_2$O) is supplied thereto. Water vapor is supplied thereto so that metallic adsorbates or ionized contaminants on the surface of the silicon carbide are oxidized and final oxides are removed, thereby achieving high purity of the surface.

(2) Heat-Treatment Process for Improving an Etching Characteristic (H-Clean)

H-clean is a process for improving an etching characteristic using the α-SiC phase-transition process for the silicon carbide obtained through the embodiment of FIG. 3.

A vacuum state is maintained using a high-temperature vacuum furnace oven or a microwave vacuum oven. A process temperature is 1,500 to 3,000° C. and a maintenance time is 30 minutes to 6 hours. As such, the time may be adjusted according to the required process conditions. The temperature and time may be adjusted according to the required process conditions. In addition, the optimum heat-treatment conditions, obtained based on the results of repeated experimentation, include maintaining a temperature of 2,000 to 2,500° C. for 3 to 4 hours.

XRD Analysis Result of Conventional CVD-SiC

XRD analysis was performed to confuin the lattice structure (crystal structure) of conventional CVD-SiC.

Figure 7:
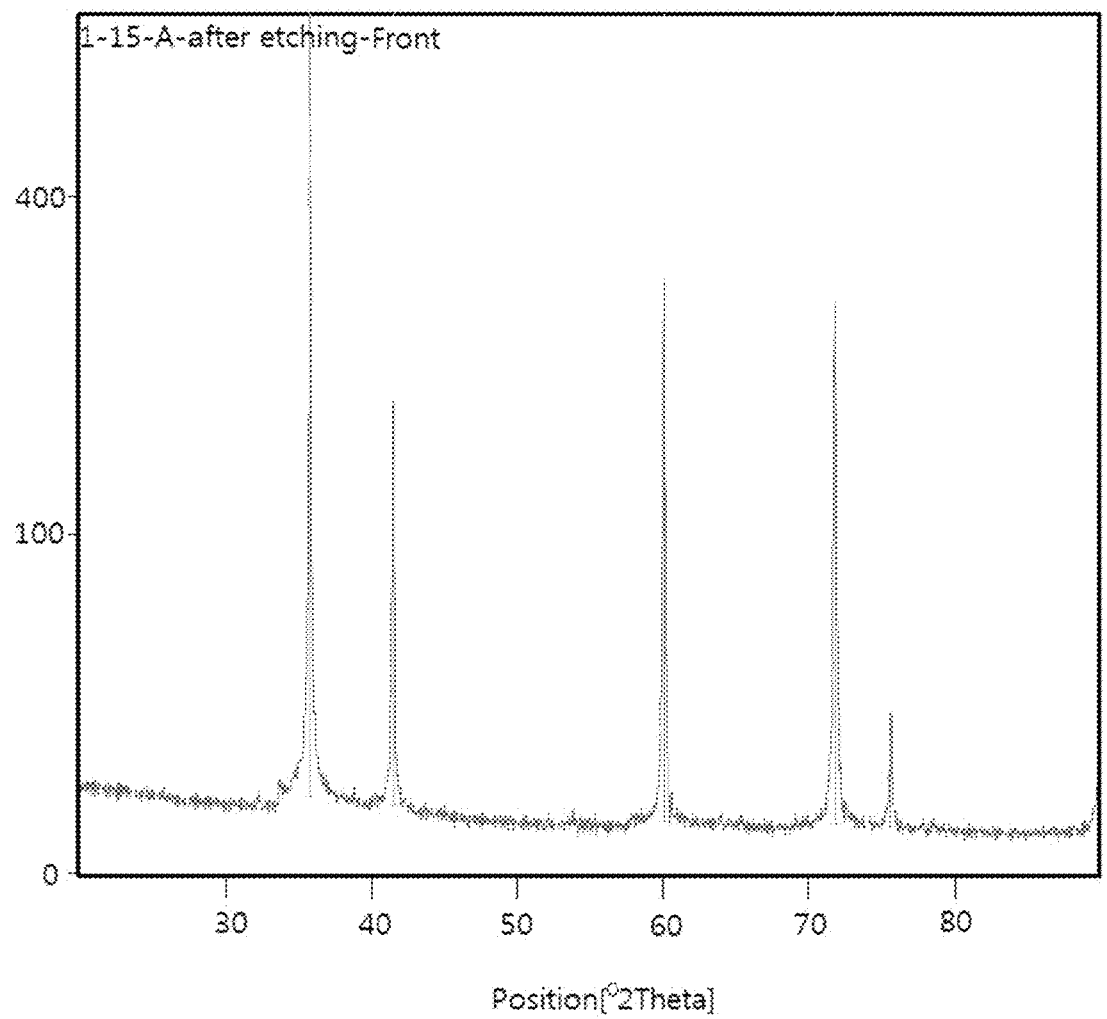
FIG. 7 is a graph showing a peak value of a conventional product with respect to an XRD analysis result.

FIG. 7 is a graph showing the peak value of a conventional product with respect to an XRD analysis result.

In addition, Table 4 shows a peak list, and values thereof are numerical values representing the graph values of FIG. 7 through a table. Further, Table 5 shows an identified pattern list of FIG. 7 and Table 4, and a reference code is shown. That is, in Table 5, the number "03-065-0360" is the reference code.

TABLE 4

| Pos. [°2Th.] | Height [crs] | FWHM [°2Th.] | d-spacing [Å] | Rel. Int. [%] | Tip width [°2Th.] | Matched by |
|---|---|---|---|---|---|---|
| 35.7349 | 20179.83 | 0.0836 | 2.51062 | 100.00 | 0.1004 | 03-065-0360 |
| 41.5081 | 5946.19 | 0.1020 | 2.17379 | 29.47 | 0.1224 | 03-065-0360 |
| 60.0779 | 8677.15 | 0.1020 | 1.53879 | 43.00 | 0.1224 | 03-065-0360 |
| 71.8475 | 8034.19 | 0.1224 | 1.31292 | 39.81 | 0.1469 | 03-065-0360 |
| 75.5752 | 600.89 | 0.1428 | 1.25715 | 2.98 | 0.1714 | 03-065-0360 |

TABLE 5

| Visible | Ref. Code | Score | Compound Name | Displacement [°2Th.] | Scale Factor | Chemical Formula |
|---|---|---|---|---|---|---|
| * | 03-065-0360 | 91 | Silicon Carbide | 0.077 | 0.876 | SiC |

From FIG. 7 and Tables 4 and 5, it can be confirmed that the lattice structure of the conventional CVD-SiC is 3C-SiC.

XRD Analysis Result of the Present Invention

XRD analysis was performed in order to confirm the lattice structure (crystal structure) of CVD-SiC after using the process of the present invention and performing heat treatment (H-clean) to improve the etching process.

Figure 8:
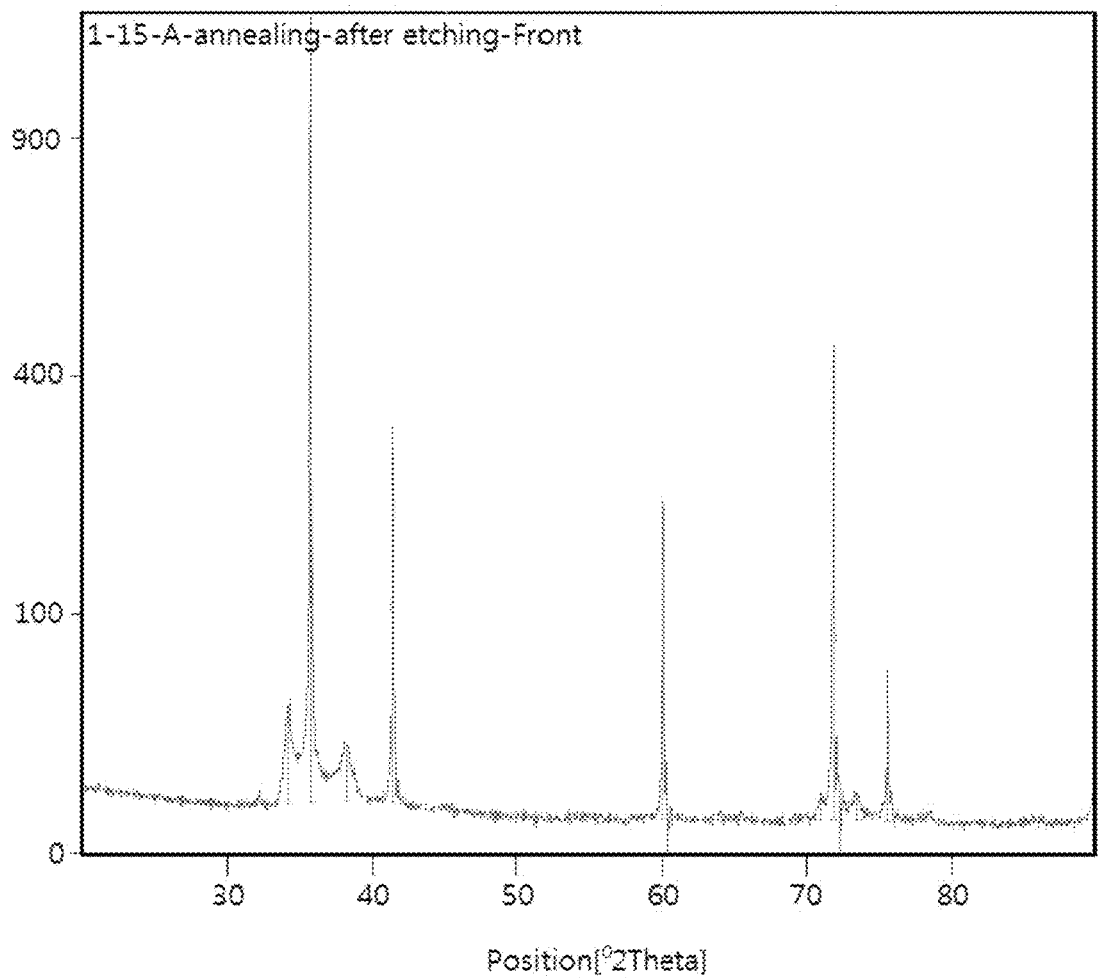
FIG. 8 is a graph showing a peak value with respect to an XRD analysis result after α-SiC phase-transition (H-clean) treatment using the process of the present invention.

FIG. 8 is a graph showing a peak value with respect to an XRD analysis result after the two-stage heat treatment (H-clean) using the process of the present invention.

When comparing FIGS. 7 and 8, five sharp peaks may be observed in FIG. 7. In FIG. 8, five sharp peaks may be observed, but small peaks may also be observed around the sharp peak. In addition, when the small peaks are observed around the sharp peak as shown in FIG. 8, it can be seen that 6H-SiC is obtained.

Table 6 shows a peak list, and values thereof are values more specifically representing the graph values of FIG. 8 through a table. Further, Table 7 shows an identified pattern list, and also shows reference codes of FIG. 8 and Table 6.

That is, in Table 7, the number "03-065-0360" is the reference code representing 3C-SiC, and the number "00-049-1428" is the reference code representing 6H-SiC. That is, 6H-SiC is confirmed, in addition to 3C-SiC, at the peaks of FIG. 8.

Meanwhile, in Table 6, it can be confirmed that there are six peaks having the reference code (004-049-1428) of 6H-SiC (shown in red in Table 6).

TABLE 6

| Pos. [°2Th.] | Height [cts] | FWHM [°2Th.] | d-spacing [Å] | Rel. Int. [%] | Tip width [°2Th.] | Matched by |
|---|---|---|---|---|---|---|
| 34.1705 | 1440.34 | 0.2342 | 2.62190 | 3.85 | 0.2810 | 00-049-1428 |
| 35.7419 | 37428.68 | 0.0612 | 2.51015 | 100.00 | 0.0734 | 03-065-0360; 00-049-1428 |
| 38.2289 | 658.16 | 0.3672 | 2.35238 | 1.76 | 0.4406 | 00-049-1428 |
| 41.4773 | 9162.67 | 0.0816 | 2.17533 | 24.48 | 0.0979 | 03-065-0360; 00-049-1428 |
| 45.1839 | 29.54 | 0.9792 | 2.00512 | 0.08 | 1.1750 | 03-065-0360; 00-049-1428 |
| 60.0467 | 5982.16 | 0.0816 | 1.53951 | 15.98 | 0.0979 | |
| 70.9507 | 121.22 | 0.3264 | 1.32729 | 0.32 | 0.3917 | |
| 71.8264 | 12395.27 | 0.0816 | 1.31325 | 33.12 | 0.0979 | 03-065-0360 |
| 73.4117 | 154.22 | 0.4896 | 1.28876 | 0.41 | 0.5875 | |
| 75.5633 | 1556.31 | 0.1020 | 1.25732 | 4.16 | 0.1224 | 03-065-0360 |

TABLE 7

| Visible | Ref. Code | Score | Compound Name | Displacement [°2 Th.] | Scale Factor | Chemical Formula |
|---|---|---|---|---|---|---|
| * | 03-065-0360 | 39 | Silicon Carbide | 0.000 | 0.285 | Si C |
| 6H-Phase * | 00-049-1428 | 45 | Silicon Carbide | 0.000 | 0.122 | Si C |

In conclusion, from FIG. 8 and Tables 6 and 7, which are the embodiments of the present invention, it can be confirmed that the lattice structure of the CVD-SiC of the present invention is 6H-SiC.

Measurement of Ratio Change between 3C-SiC and 6H-SiC

The ratio of 6H-SiC could be confirmed from the result of XRD analysis shown in FIG. 8. That is, the component ratio can be confirmed using the height difference between 3C-SiC and 6H-SiC peaks.

When the temperature of the α-SiC phase-transition heat treatment (H-clean) was set to 1,500° C. and the CVD-SiC was maintained for about 1 hour after the CVD-SiC was manufactured by introducing the manufacturing process conditions of the present invention, it could be seen that the ratio of 6H-SiC was 10%.

In addition, when the ratio of 6H-SiC was measured after the time of the α-SiC phase-transition heat treatment (H-clean) was increased up to 7 hours, it could be seen that the ratio of 6H-SiC was increased to 70%. That is, it can be seen that the ratio of 6H-SiC to total SiC is 10 to 70%. In other words, it can be expressed as follows.

10≤((mass of 6H-SiC)/((mass of 6H-SiC) +(mass of 3C-SiC)))×100≤70. Meanwhile, when 6H-SiC is increased, the density of the tissue increases and the etching characteristics are improved. Accordingly, it is possible to manufacture CVD-SiC so that the yield is improved and costs are reduced to thus increase productivity in the etching manufacturing process.

Figure 9A:
FIG. 9 is a photograph showing crystal structures of the conventional SiC and the 6H-SiC of the present invention.
Figure 9B:

FIG. 9 is a photograph showing the crystal structures of conventional SiC and 6H-SiC of the present invention.

As can be seen from FIG. 9, when the CVD-SiC microstructures were compared, the density of the tissue was much denser after the α-SiC phase-transition heat treatment (H-clean). That is, from the XRD analysis result and microstructure confirmation, it could be seen that 3C-SiC was converted into 6H-SiC after the α-SiC phase-transition heat treatment (H-clean), and thus the density of the tissue thereof increased.

The present invention is also a commercially applicable technology in that the service lifespan is improved by applying 3C-SiC, grown using a CVD method, to an etch ring for the etching process.

FIG. 9 shows a tissue structure enlarged 1200 times using an optical microscope.

From the photograph of FIG. 9, it can be seen that a large number of comb patterns (twin) are formed in the 6H-SiC crystal structure of the present invention. However, it can be seen that comb patterns (twin) are formed in a small number in a conventional SiC crystal structure.

Meanwhile, when the boundary between the grains is referred to as a grain boundary and the inside of the grain is referred to as the inner part of the grain, the number of comb patterns (twin) was significantly increased in the inner part of the grain in the SiC of the present invention compared to conventional SiC.

Figure 10:
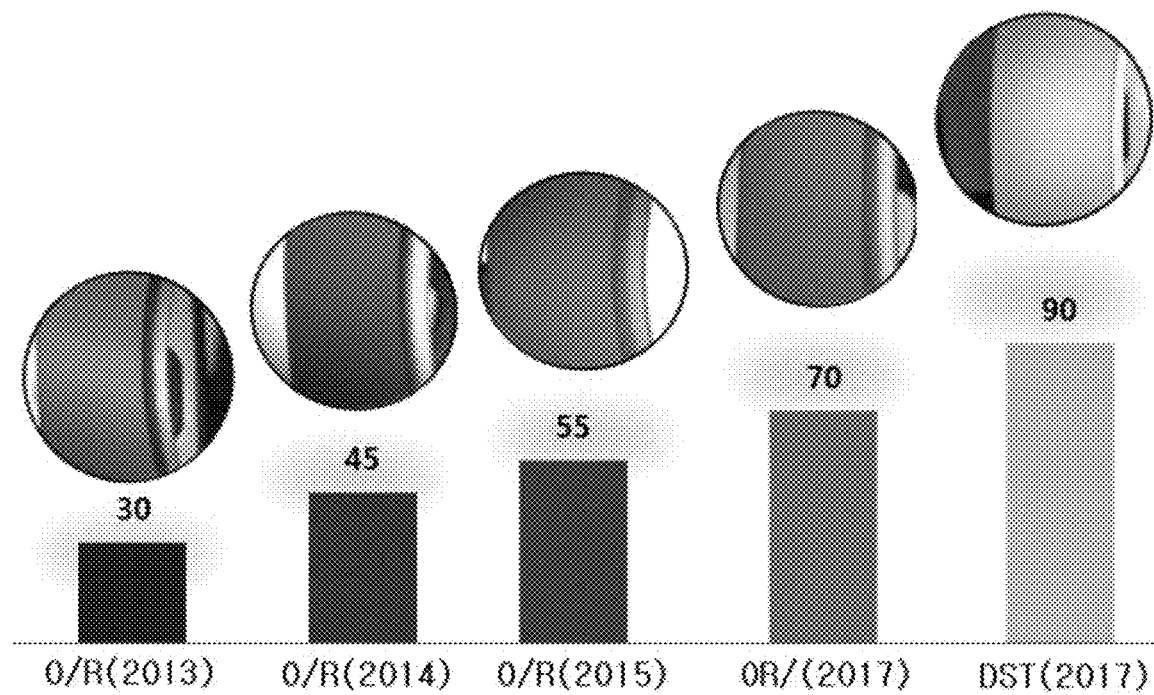
FIGS. 10 and 11 are views showing crystallinity according to the CVD-SiC light transmittance of the product of the present invention.
Figure 11:
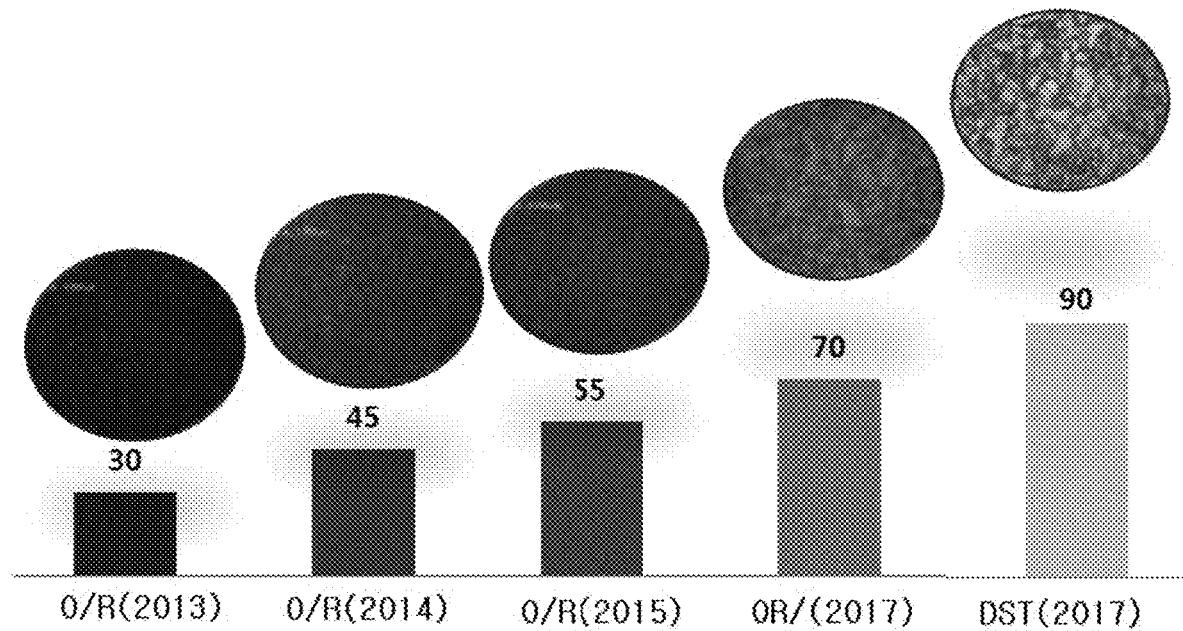

FIGS. 10 and 11 are views showing crystallinity according to the CVD-SiC light transmittance of the product of the present invention.

In FIGS. 10 and 11, "O/R" is a conventional product and "DST" is the product of the present invention. The SIC of the present invention is manufactured in the form of a specimen having a thickness ranging from 5 mm to 15 mm, and it can be seen that a yellow wavelength is transmitted therethrough when white LED light is radiated thereon.

The yellow wavelength of the white LED light is transmitted, thus imparting a yellow color to the product, which is a feature of the product of the present invention.

Figure 12:
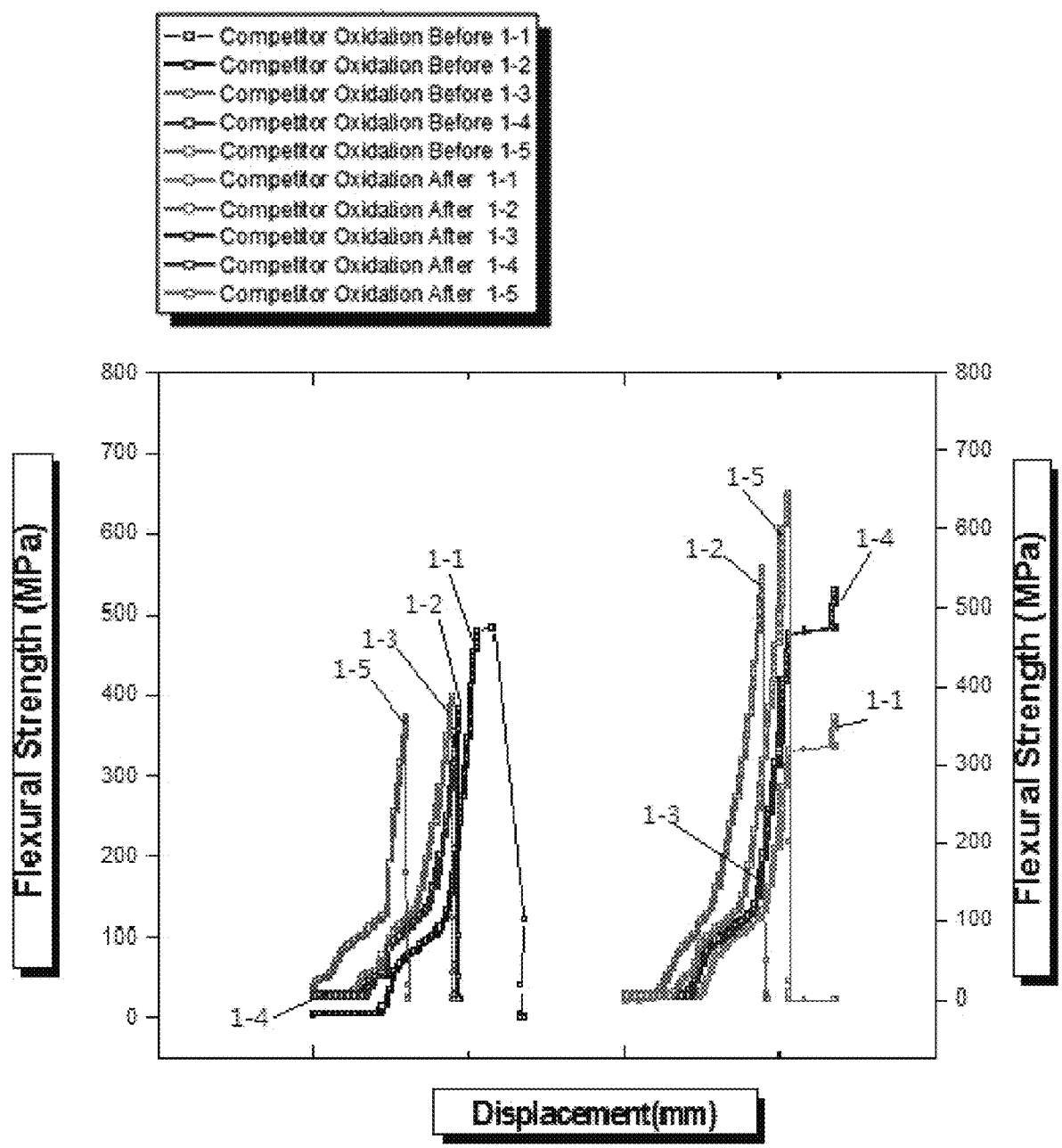
FIGS. 12 and 13 are views showing bending strengths of the conventional SiC and the 6H-SiC of the present invention.
Figure 13A:
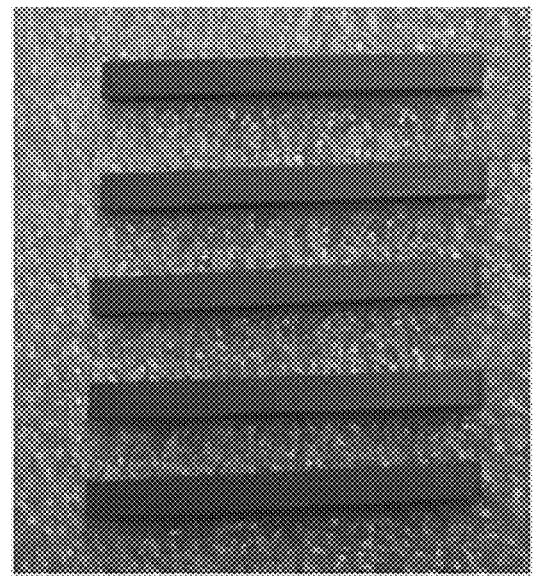
Figure 13B:
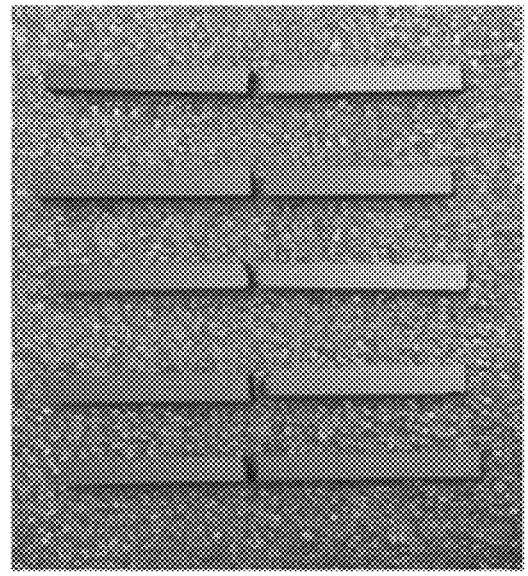
Figure 13C:
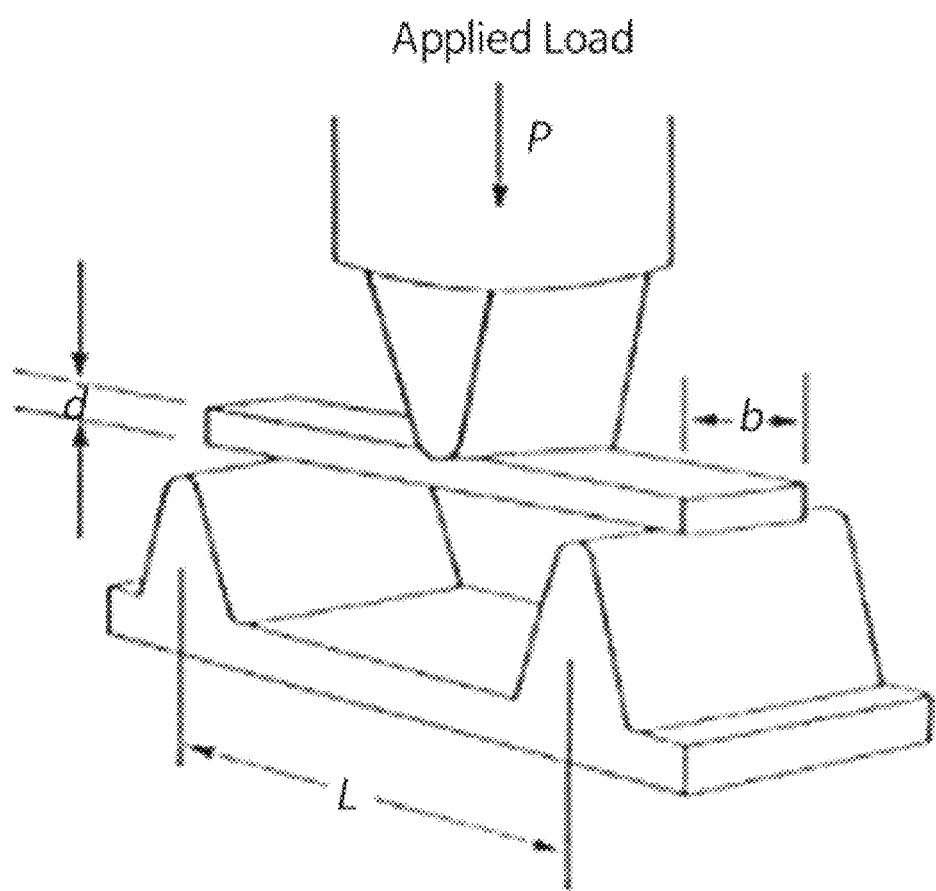

FIGS. 12 and 13 are views showing bending strengths of SiC including the conventional SiC and the 6H-SiC of the present invention.

The 6H-SiC of the present invention showed the results of an increase in bending strength and a decrease in deviation.

That is, as shown in FIG. 13, the bending strength of conventional SiC is 350 to 500 MPa, and the bending strength of the product containing the 6H-SiC of the present invention is 350 to 650 MPa.

Figure 14:
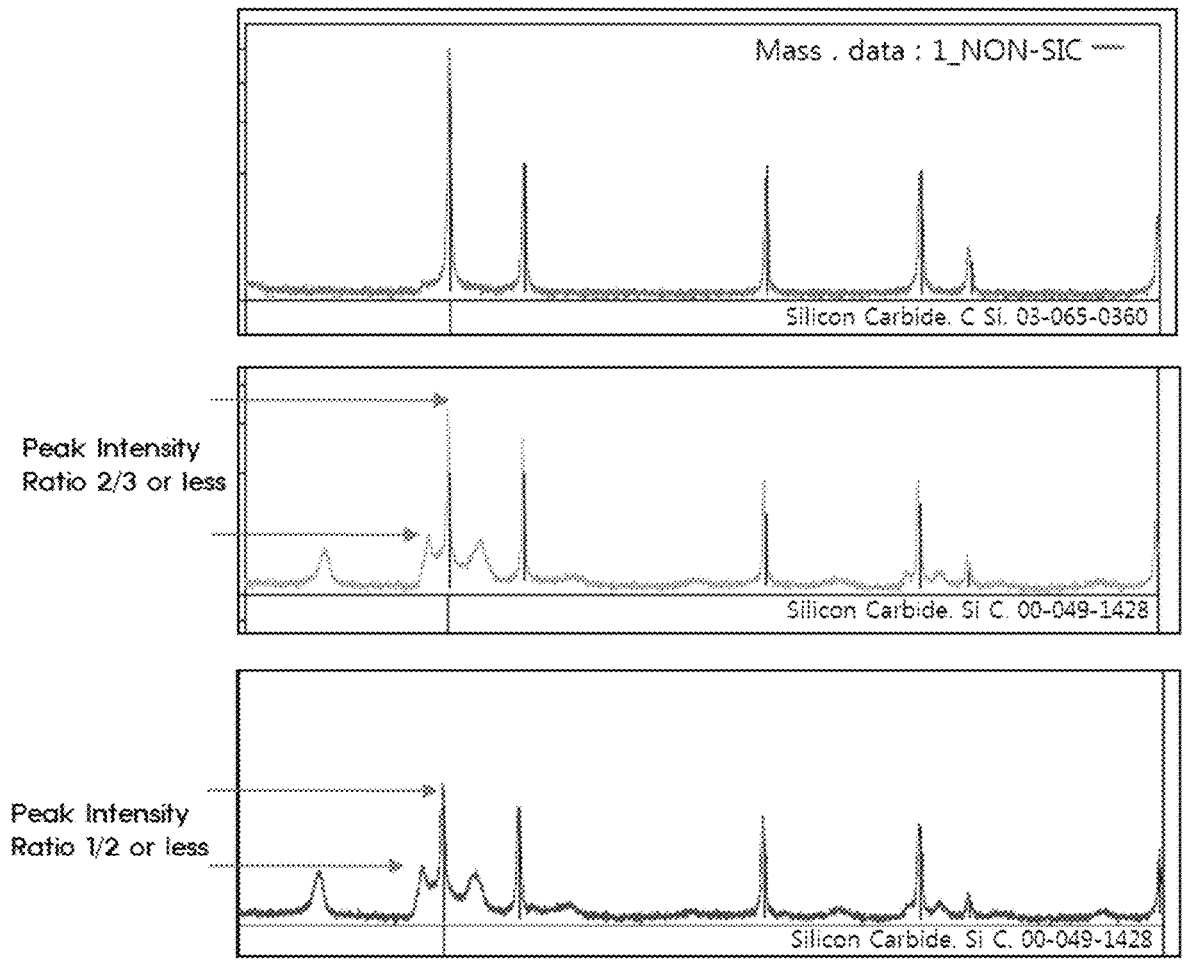
FIG. 14 is a view showing an XRD peak, which shows a method of checking the ratio of 3C-SiC and 6H-SiC.

In addition, FIG. 14 is a view showing a method of measuring the bending strength. That is, FIG. 14(A) shows the prepared specimen, FIG. 14(B) shows the specimen with cracks after a bending strength test, and FIG. 14(C) shows the principle of the bending strength test. FIG. 14(C) shows how much the specimen needs to be bent (mm) to form cracks.

Meanwhile, the conditions of the samples used in the bending strength test are as follows.

Sample size: width 10 mm, thickness 4 mm
Point distance 20 mm, load displacement 0.01 mm In addition, as a result of bending strength measurement, the average displacement amount of the conventional SiC is 0.087 mm, and the average displacement amount of the SiC containing the 6H-SiC of the present invention is 0.096 mm.

Meanwhile, when the SiC of the present invention was observed using a high-magnification microscope, the characteristics thereof were as follows.

☐ Microtissue of growth surface of formed film of CVD-SiC
  X500 magnification, Optical Microscope
  ZONE III growth type (Competitive texture)
  Grain Size: about 40 to 100 μm
  Packed Fibrous Grain: about 20 to 40 μm
  Formed film is under a condition of Ts/Tm of 0.5 or more Therefore, the average grain size of the growth surface was confil med to be about 40 to 100 μm, and voids trap (self shadowing) between grain boundaries as a ZONE II growth type did not appear.

☐Columnar tissue of cross section of formed film of CVD-SiC
  X500 magnification, Optical Microscope
  ZONE III growth type (Competitive texture)
  Columnar Grain: about 70 to 120 μm
  Packed Fibrous Grain: about 20 to 40 μm
  Intermediate of foiined film is under a condition of Ts/Tm of 0.5 or more Both sides of formed film are under a condition of Ts/Tm of 0.2 or more Therefore, the average columnar grain size of the formed film was confirmed to be about 70 to 120 μm. Further, in some cases, well-developed equiaxed grain tissues over 150 μm in size were observed, indicating an excellent tissue state.

FIG. 14 is a view showing an XRD peak, which shows a method of checking the ratio of 3C-SiC and 6H-SiC.

The graph at the top in FIG. 14 shows that there are only five peaks of 3C-SiC, as a conventional product.

In addition, the second graph from the top in FIG. 14 shows that the peak height of 6H-SiC is about 30% of the peak height of 3C-SiC. Therefore, in this case, the ratio value of 6H-SiC to total SiC is 23%.

Further, the graph at the bottom in FIG. 14 shows that the peak height of 6H-SiC is 50% of the peak height of 3C-SiC. Therefore, in this case, the ratio value of 6H-SiC to total SiC is 33%.

As a result of various comparative experiments using the above-described method, in the present invention, it was confirmed that the ratio value of 6H-SiC to total SiC was in the range of 10% to 70%.

Figure 15:
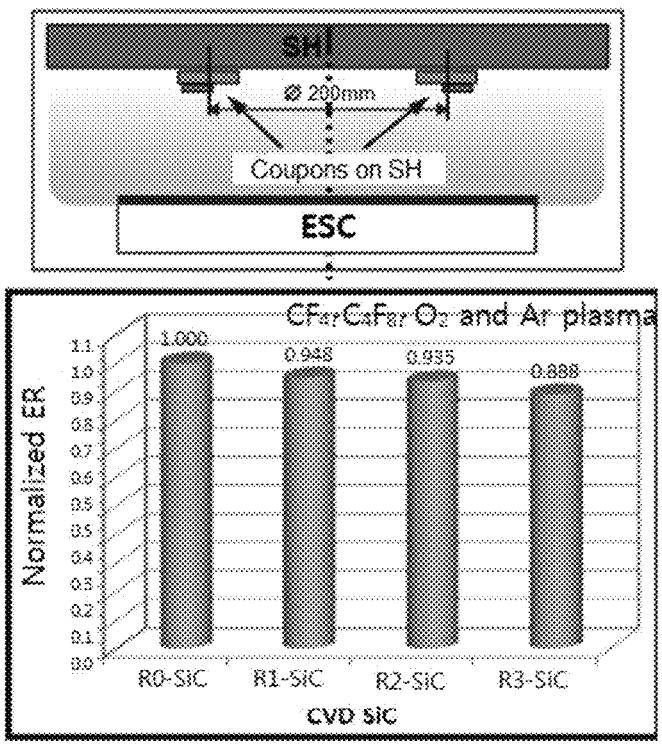
FIGS. 15 to 17 show a change in the etching amount after an etching test.
Figure 15:
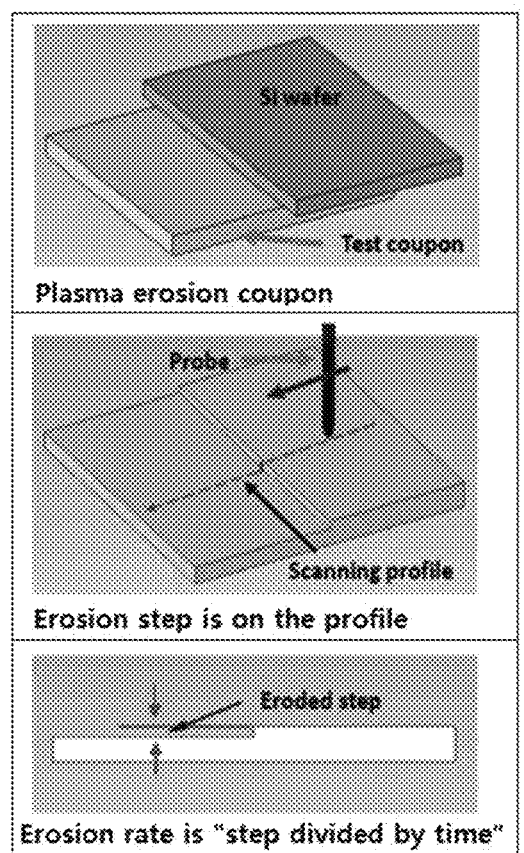
Figure 16A:
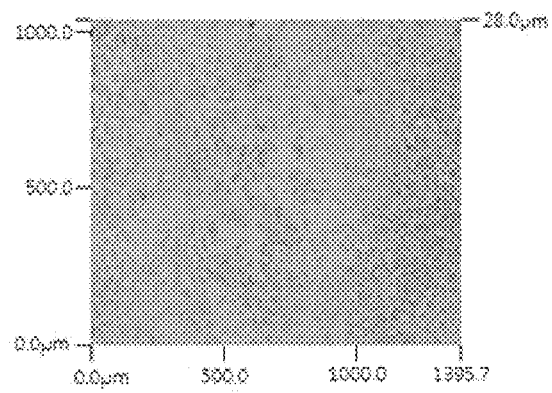
Figure 16B:
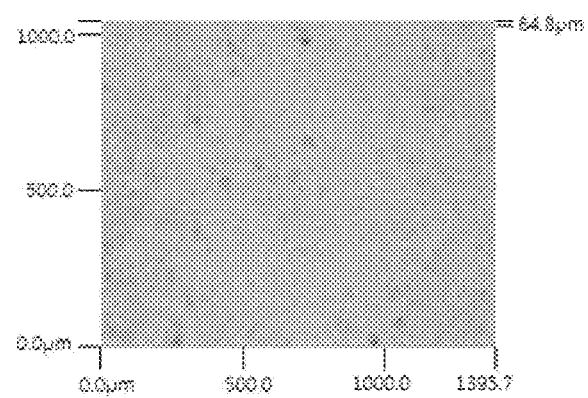
Figure 16C:
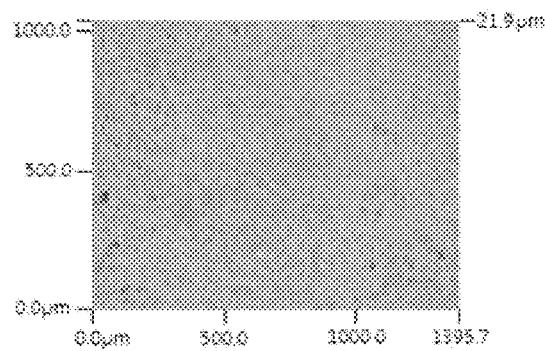
Figure 16D:
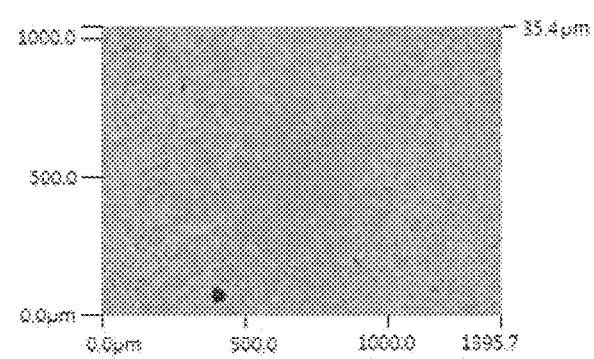

FIGS. 15 to 17 show a change in etching amount after an etching test.

That is, from the experiments of FIGS. 15 to 17, it can be seen that the product of the present invention has higher etching resistance than a conventional product.

FIG. 15 is a view showing etching and an etching rate in a plasma chamber.

FIG. 16 is a view showing changes in roughness after the etching test.

That is, FIG. 16 shows changes in the roughness of the conventional SiC and the 6H-SiC of the present invention after the etching test.

The surface roughness Ra value of the 6H-SiC of the present invention is measured to be 2.0 or less, which shows that the etching amount is reduced compared to conventional SiC.

FIG. 17 is a photograph showing a tissue shape observed using a 1200 magnification optical microscope.

Figure 17A:
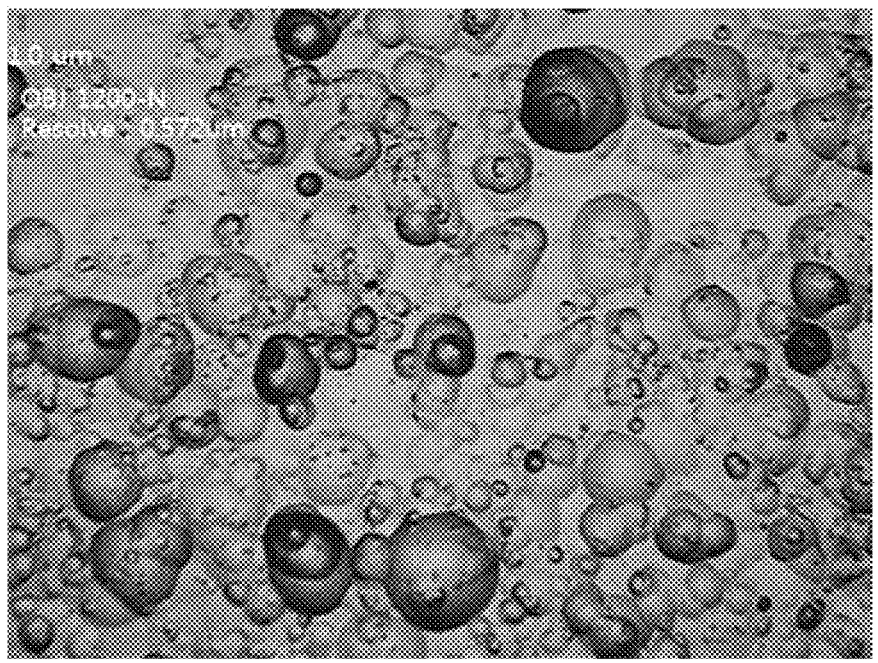
Figure 17B:
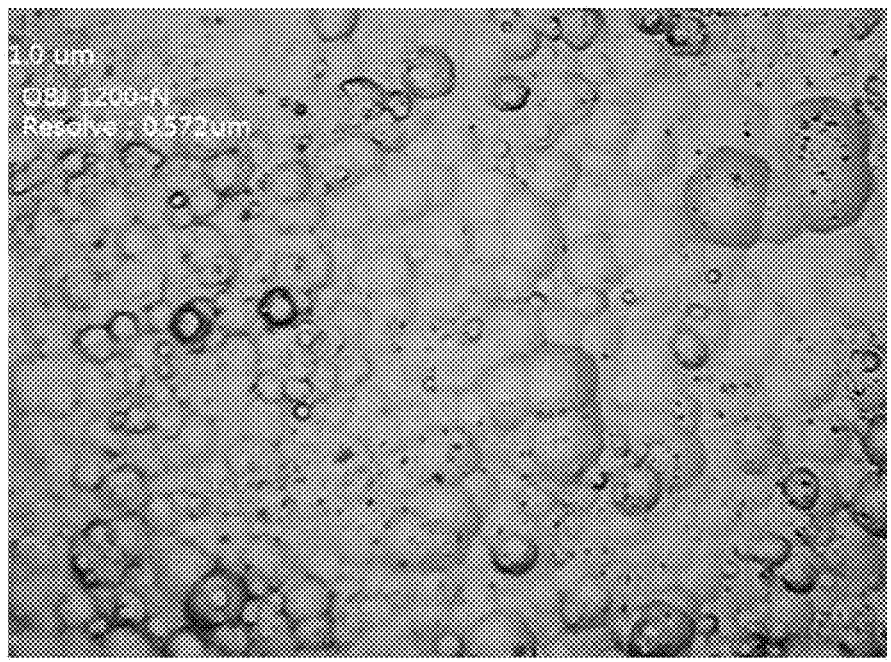

FIG. 17(A) is a photograph of a conventional product after etching, and FIG. 17(B) is a photograph of the product of the present invention after etching.

In the photograph of FIG. 17(A), a round shape surrounded by the dark periphery appears, and this round shape is a portion in which the tissue is gouged due to etching. However, this round shape does not appear in FIG. 17(B). Therefore, it can be confirmed that the product of the present invention is excellent in etching characteristic.

Multilayer Structure

In the embodiment of the present invention, the SiC bulk may be manufactured so as to have a multilayer structure.

The present invention provides a method of supplying nitrogen when SiC is manufactured (a technical description of the method of supplying nitrogen is given in the description of the embodiments of FIGS. 1 to 6 of the present invention). In addition, the ratio of 6H-SiC to total SiC may be adjusted using a phase-transition method. Further, when the white light is transmitted through the SiC specimen, as in the embodiments of FIGS. 10 and 11 of the present invention, transmitted light may be observed.

In general, it takes about seven days to manufacture the SiC bulk, and the thickness of the SiC that is manufactured is about 3 mm (here, the period may vary depending on the thickness of the SiC bulk to be manufactured, and accordingly, the technology of the present invention is not necessarily limited to the above-described numeric value of 3 mm).

In addition, a spray nozzle used during the manufacture of the SiC bulk is replaced. That is, a thickness of 3 mm is not obtained through a single process. The nozzle is replaced six times, thus manufacturing a SiC bulk having a thickness of 3 mm through six manufacturing processes.

When the nozzle is replaced, the amount of nitrogen that is supplied may be changed, so the resistance value varies depending on each layer of the SiC bulk. Further, the phase-transition process may be changed after a single coating process or after three or four coating processes, so the ratio of 6H-SiC to total SiC varies depending on the layer.

Change of 6H Peak

The present invention has a phase-transition effect, and a change in the 6H peak is observed depending on the heat treatment conditions.

Figure 18:
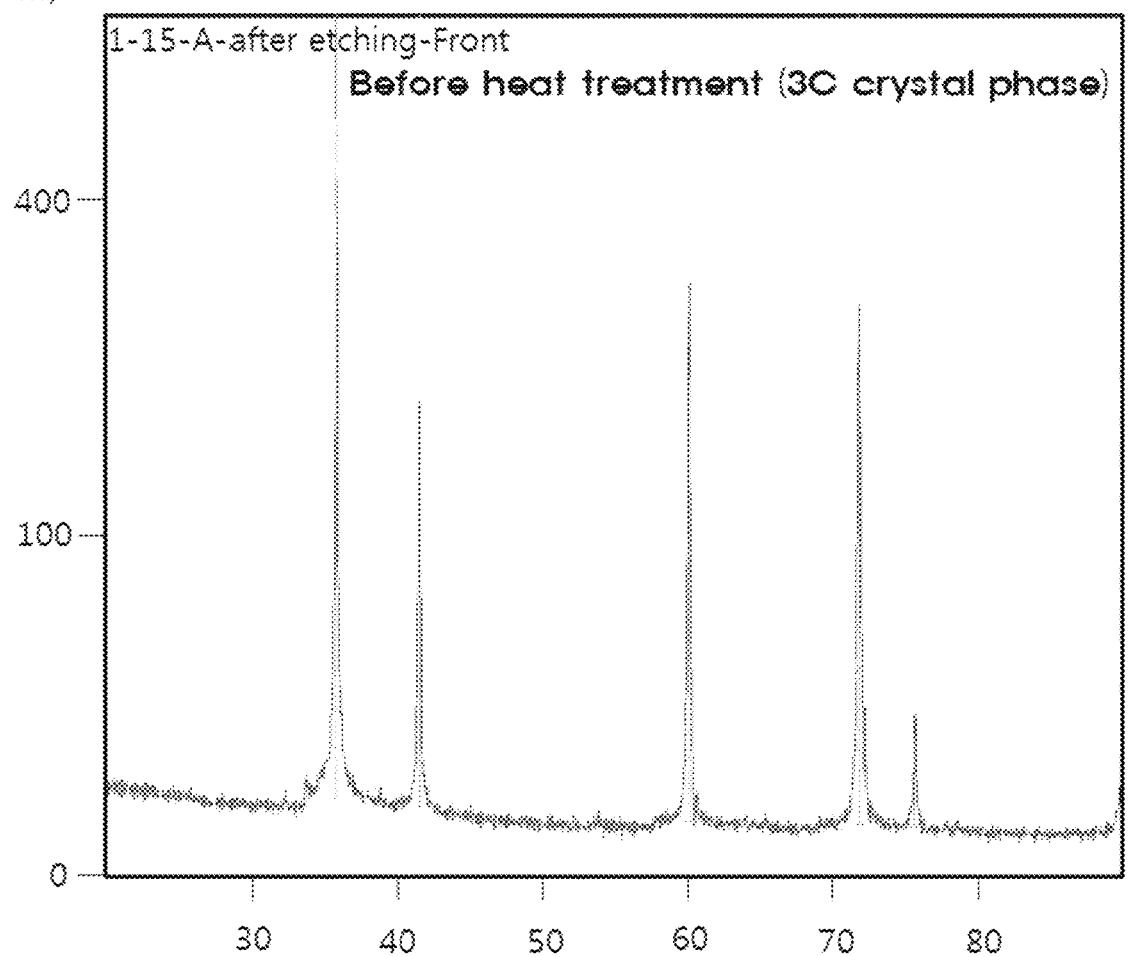
FIG. 18 is a view showing peaks (XRD analysis result) of the SIC bulk manufactured using a chemical vapor deposition method.

FIG. 18 is a view showing peaks (XRD analysis result) of the SIC bulk manufactured using a chemical vapor deposition method.

The SIC bulk is 3C-SiC.

Figure 19:
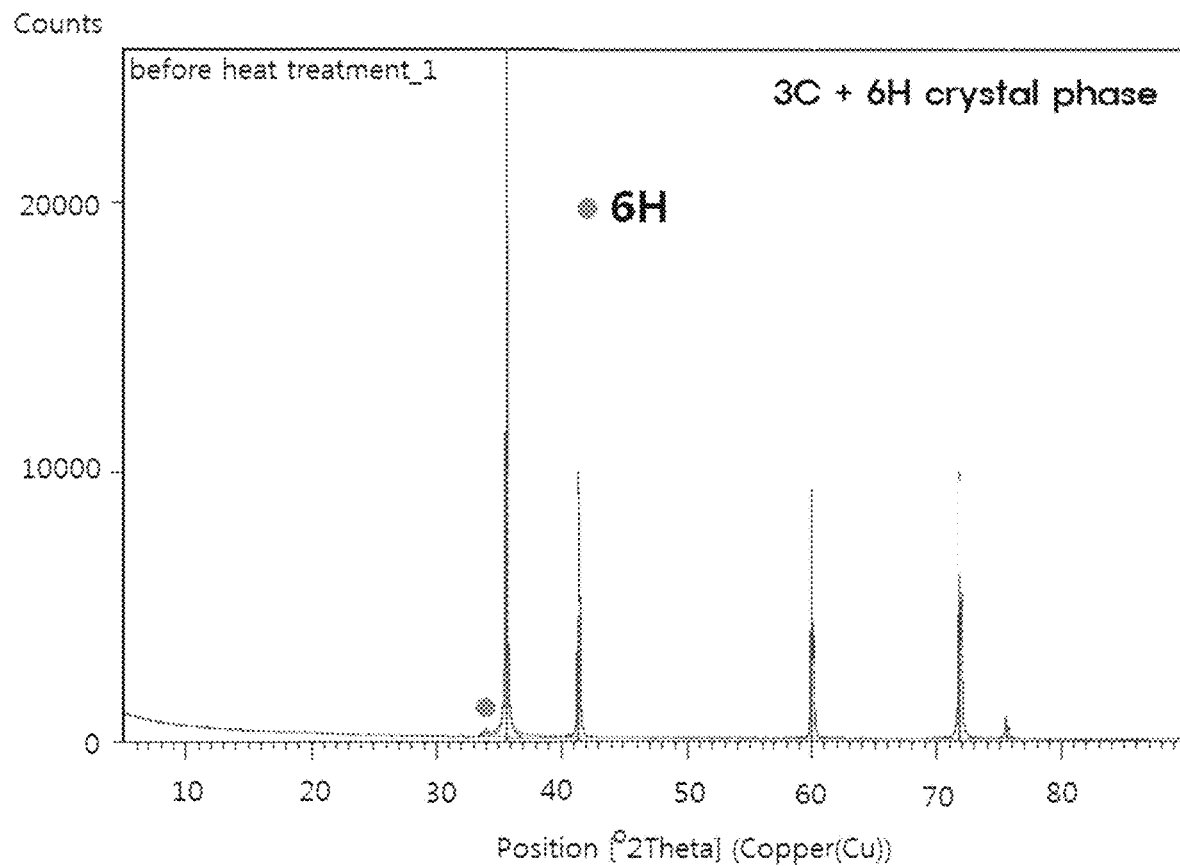
FIGS. 19 to 21 are views showing the results of XRD analysis after heat treatment of the 3C-SiC.
Figure 20:
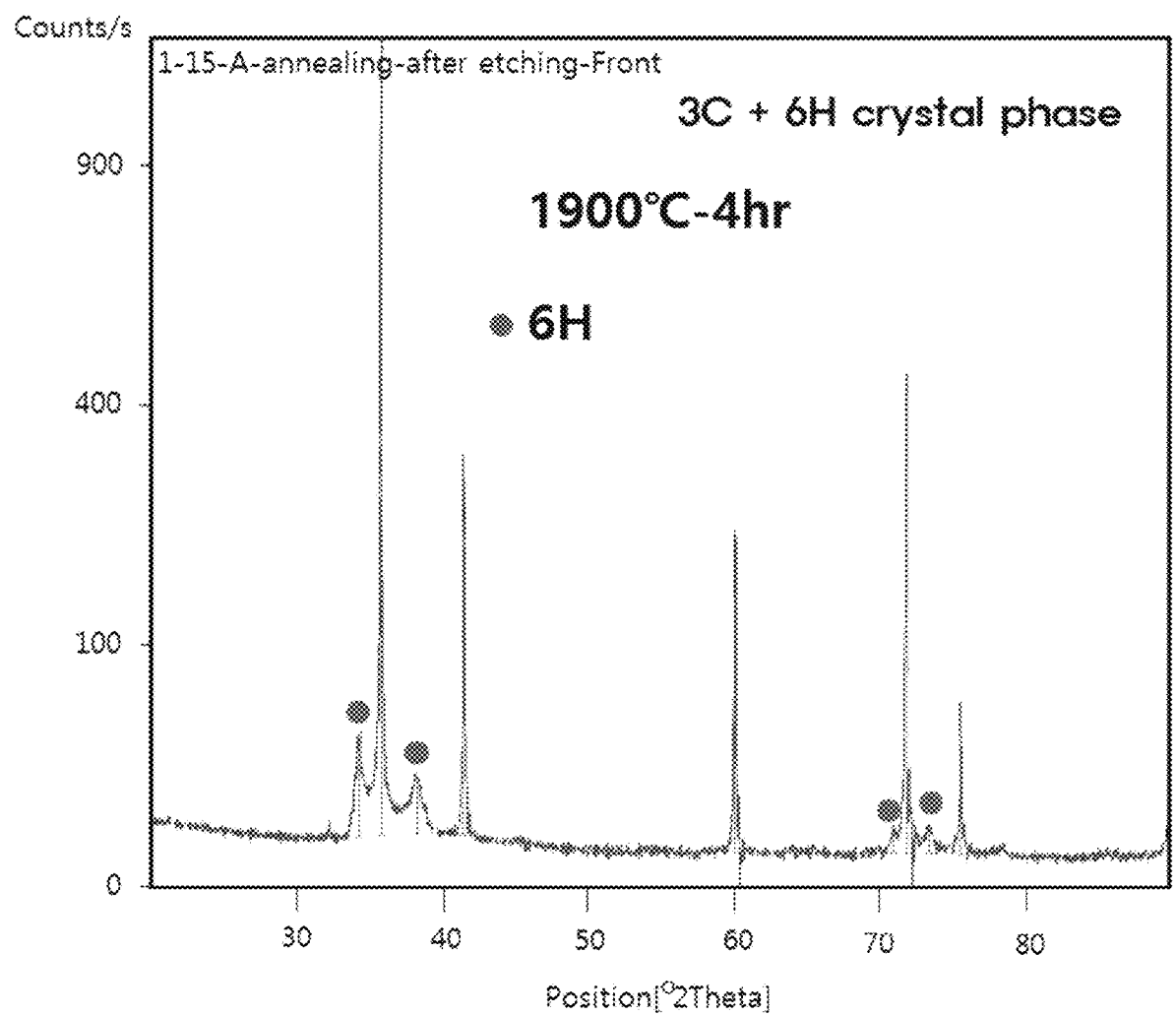
Figure 21:
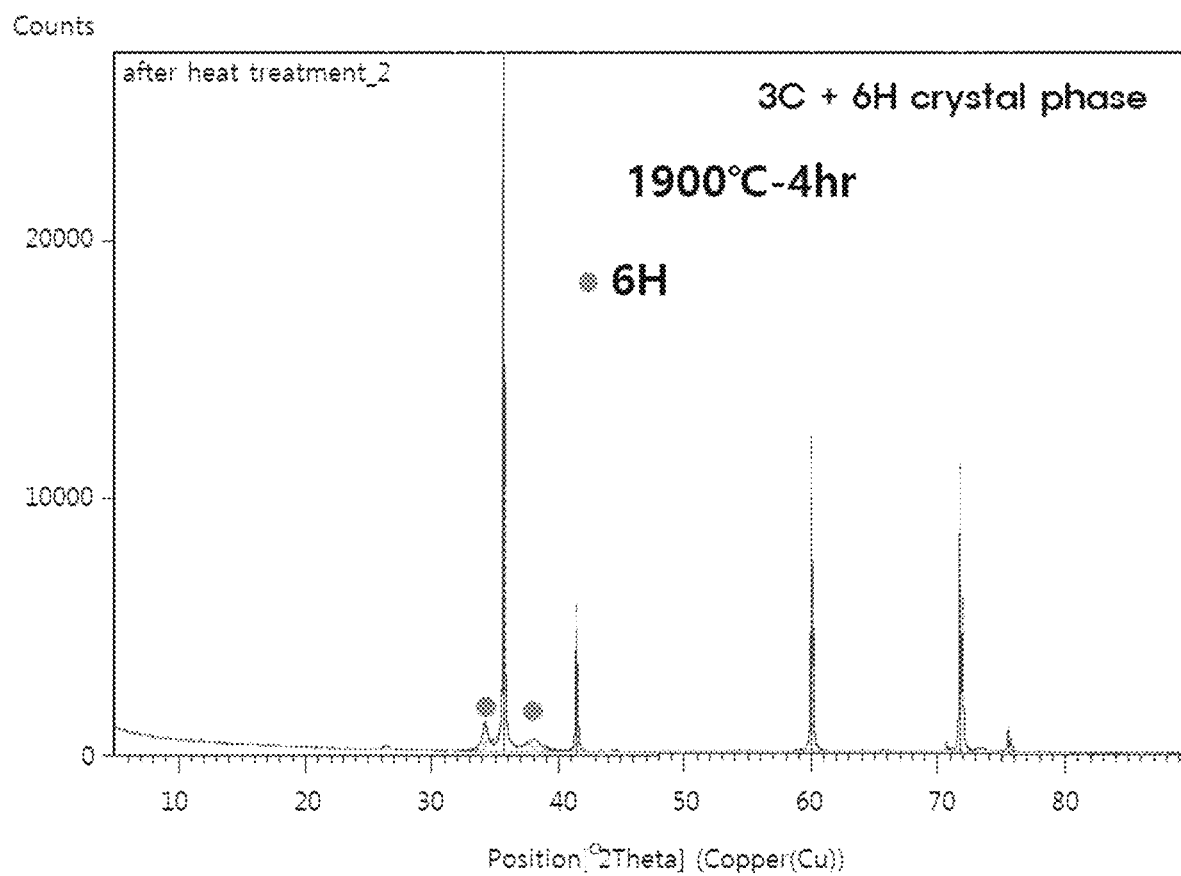

FIGS. 19 to 21 are views showing the results of XRD analysis after heat treatment of the 3C-SiC.

When the SiC bulk is subjected to the phase-transition process as shown in the drawings, it can be seen that a 6H-SiC peak is present. In addition, the 6H-SiC is generated by performing phase transition of a part of the 3C-SiC. Accordingly, the height of the peak of the 6H-SiC may vary depending on the conditions of the phase-transition process (the heat-treatment process proposed by the above-described embodiments of the present invention).

In addition, the difference in height of the peak of the 6H-SiC means that the component ratios of the 6H-SiC to total SiC are different from each other. That is, the ratios of the 6H-SiC to total SiC are different from each other.

As a result of experiments by this company, the 6H-SiC may depend on the heat treatment as follows.

Case in which the 6H-SiC is observed with small peaks (see FIG. 19):

This is the case in which heat treatment is insufficiently performed. One 6H-SiC peak may be found, and the ratio of 6H-SiC to total SiC may be as low as 1% or less. Alternatively, the 6H-SiC may account for a very small amount of total SiC.

Case in which the 6H-SiC is found with a main peak and a subpeak (see FIGS. 20 and 21):

This is the case in which heat treatment is sufficiently performed. The 6H-SiC is found with the main peak and the subpeak. Alternatively, the 6H-SiC may be found with six peaks, as shown in Table 6 of the present invention.

As a result, the 3C crystal phase has five peaks having a reference code of 03-065-0360, and the 6H crystal phase (peak having a reference code of 00-049-1428) to depends on the phase-transition process.

Meanwhile, the 6H main peak is observed at a location of $2\Theta=34.1705°\pm0.5°$.

Characteristic Change in SiC Bulk

In the present invention, the characteristics of the SiC bulk that is manufactured are changed by adjusting the concentrations and the ratios of nitrogen, MTS, and hydrogen. In addition, the characteristic changes thereof are as follows.

The concentration of nitrogen in the SiC bulk varies from $10\times10^{16}$ atoms/cc to $10\times10^{20}$ atoms/cc.

The resistance value of the SiC bulk varies from 0.01 ohm-cm to 80 Ohm-cm.

The thermal conductivity varies from 150 W/mK to 500 W/mK.

Flexural strength is capable of varying from 400 MPa to 500 MPa.

However, impurities ((Al, B, Cl, Fe, Ni, and S) in the SiC bulk are maintained at 6 ppmw or less.

Change of Characteristics According to Layers

When the number of SiC bulk layers is two or more, there is a characteristic difference according to the layers.

That is, the conditions may be changed as follows in the middle of a process of manufacturing the SiC bulk.

The spray nozzle may be replaced.

The nitrogen concentration value may be changed.

The hydrogen concentration value may be changed.

The MIS concentration value may be changed.

Alternatively, a phase-transition process (heat-treatment process) may be performed, and the conditions of the phase-transition process may be changed.

In the above, the phrase "in the middle of a process of manufacturing the SiC bulk" means that, for example, when SiC having a thickness of 3 mm is manufactured, the SiC having a thickness of 3 mm is not manufactured through a single step, but the conditions may be changed as noted above during the processing. For example, the nozzle used in a process of manufacturing the SiC having a thickness of 1 mm may be different from the nozzle used in a process of manufacturing the SiC so that the SiC grows from a thickness of 1 mm to a thickness of 2 mm.

In the case in which the SiC bulk includes two layers, the resistance value of the first layer is higher than that of the second layer (or vice versa). Meanwhile, in the case in which the SiC bulk includes two or more layers, the resistance value of the upper layer is higher than that of the lower layer (or vice versa).

In the case in which the SiC bulk includes two layers, the nitrogen concentration value of the first layer is higher than that of the second layer (or vice versa). Meanwhile, in the case in which the SiC bulk includes two or more layers, the nitrogen concentration value of the upper layer is higher than that of the lower layer (or vice versa).

In the case in which the SiC bulk includes two layers, the thermal conductivity of the first layer is higher than that of the second layer (or vice versa). Meanwhile, in the case in which the SiC bulk includes two or more layers, the thermal conductivity of the upper layer is higher than that of the lower layer (or vice versa).

In the case in which the SiC bulk includes two layers, the flexural strength of the first layer is higher than that of the second layer (or vice versa). Meanwhile, in the case in which the SiC bulk includes two or more layers, the flexural strength of the upper layer is higher than that of the lower layer (or vice versa).

In the case in which the SiC bulk includes two layers, the flexural strength of the first layer is higher than that of the second layer (or vice versa). Meanwhile, in the case in which the SiC bulk includes two or more layers, the flexural strength of the upper layer is higher than that of the lower layer (or vice versa).

In the case in which the SiC bulk includes two layers, the 6H peak height of the first layer is higher than that of the second layer (or vice versa). Meanwhile, in the case in which the SiC bulk includes two or more layers, the 6H peak height is higher than that of the lower layer (or vice versa).

In the case in which the SiC bulk includes two layers, the impurity value of the first layer is the same as or similar to that of the second layer. Meanwhile, in the case in which the SiC bulk includes two or more layers, the impurity value of the upper layer is the same as or similar to that of the lower layer.

Visible-Ray Wavelength

When a white LED is radiated on the specimen (see the above-described embodiment of the present invention), the wavelength band of the visible rays passing through the specimen is 565 to 590 nm.

In addition, in the case in which there are two layers, the value of visible-ray wavelength of the first layer is different from that of the second layer. Further, in the case in which there are two or more layers, the value of visible-ray wavelength of the upper layer is different from that of the lower layer.

Application of Multilayer Structure

Figure 22:
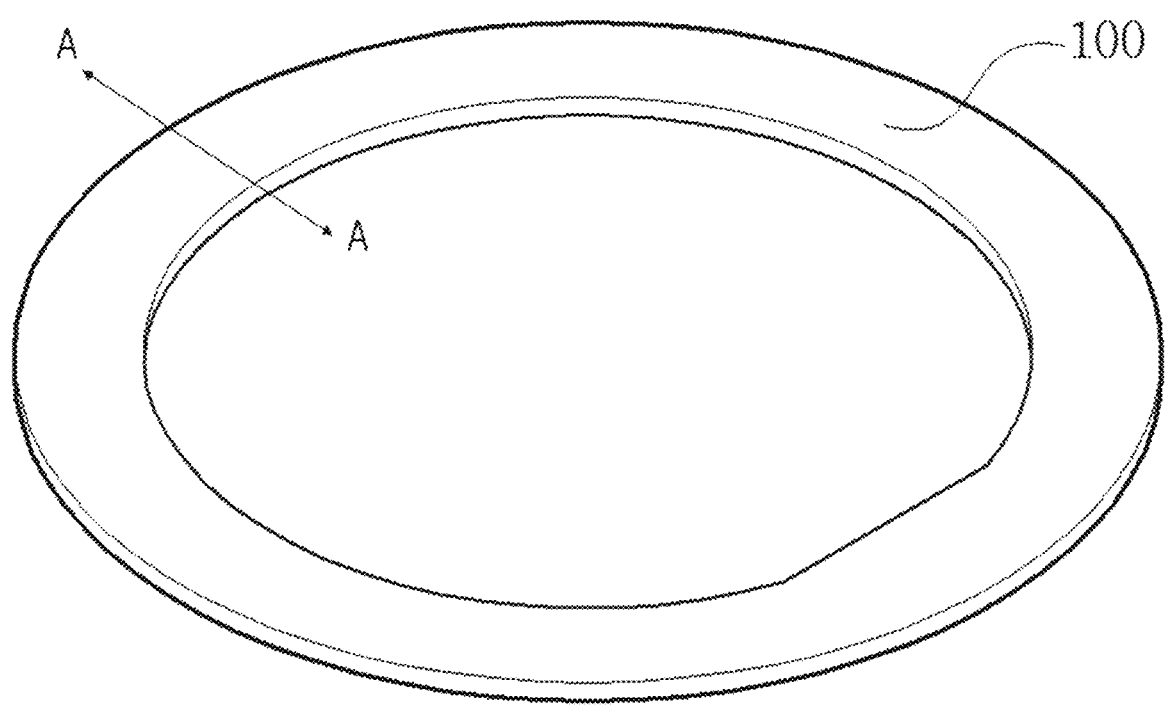
FIG. 22 is a view of an embodiment showing a focus ring.

FIG. 22 is a view of an embodiment showing a focus ring.

The silicon carbide obtained through the embodiments of FIGS. 1 to 3 of the present invention, which are the chemical vapor deposition method, is 3C-SiC, which is β-SiC. The 3C-SiC, which is the β-SiC, is converted into 6H-SiC, which is α-SiC, through the phase-transition process.

Therefore, the ratio of the 6H-SiC which is the α-SiC may be changed depending on the phase-transition process conditions.

(1) It can be seen from experiments that the ratio of 6H-SiC to total SiC is 10 to 70%. That is, phase transition from 10% of the 3C-SiC to the 6H-SiC may be performed, and phase transition from 70% of the 3C-SiC to the 6H-SiC may be performed.

In addition, this can be expressed as follows.

10 ≤((mass of 6H-SiC)/((mass of 6H-SiC) +(mass of 3C-SiC)))×100≤70. Meanwhile, when the 6H-SiC is increased, the density of the tissue increases and the etching characteristics are improved. Accordingly, it is possible to manufacture CVD-SiC so that the yield is improved and costs are reduced to thus increase the productivity of the etching manufacturing process.

(2) The 6H-SiC may account for a small amount of total SiC.

The 6H-SiC may be present in a small amount in total SiC by changing the phase-transition process (see FIG. 19 of the present invention).

As a result, in the present invention, a focus ring 100 including SiC containing 6H-SiC at a predetermined ratio is manufactured by performing phase transition of the 3C-SiC manufactured using chemical vapor deposition.

Therefore, the characteristics shown in FIGS. 4 to 21 become the characteristics of the focus ring 18 of the present invention.

Figure 23:
FIGS. 23 and 24 are views of embodiments showing the cross section of the focus ring (the cut surface assumed to be cut along the line A-A in FIG. 22).
Figure 24:
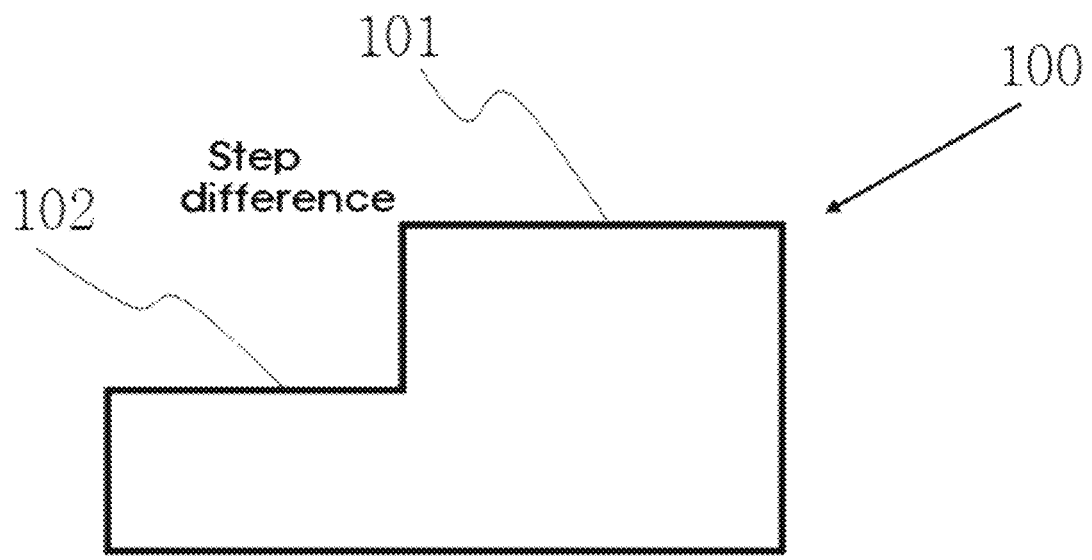

FIGS. 23 and 24 are views of embodiments showing the cross section of is the focus ring (the cut surface assumed to be cut along the line A-A in FIG. 22).

FIG. 23 is a view of an embodiment of the case where there is no step difference.

In practice, the focus ring 100 has the shape of a donut, and therefore, FIG. 23 is a cross-section of one side obtained by cutting a part of the donut shape (the cross-sectional view is assumed to be cut along the line A-A in FIG. 22).

The above-described embodiments of the present invention provide a method of adjusting the nitrogen concentration in SiC by adjusting the amount of $N_2$ in the raw material that is supplied when chemical vapor deposition is performed.

In addition, the resistance value of the SiC varies depending on the nitrogen value, and only the surface of the focus ring 100 needs to have a low resistance.

Accordingly, the intermediate portion of the cross section of the focus ring 100 does not need to have a low resistance.

That is, in the cross section of FIG. 23, the resistances of an upper layer 250-1 and a lower layer 250-3 are 0.3 Ω or less, and the resistance of an intermediate layer 250-2 may be 1 Ωor 100 Ω or more. Further, the intermediate layer may include stainless steel or aluminum.

Further, the ratio of the 6H-SiC to the total SiC may vary depending on each layer.

FIG. 24 is a view of an embodiment of the case where a step difference is present.

As shown in FIG. 24, there may be a case where a step difference is present in the focus ring having the shape of donut. FIG. 24 is a cross-sectional view assumed to be cut along the line A-A in FIG. 22.

Since the step difference is present, there are a higher side 101 and a lower side 102. In addition, the higher side 101 and the lower side 102 may be exposed to the acid at different levels in the etching process, and the external environments with respect to the higher and lower sides may be different from each other as the wafer is not loaded.

Therefore, the ratios of 6H-SiC to total SiC may be different, the resistances may be different, and the nitrogen concentrations may be different according to the higher and lower sides.

Characteristic Difference According to Step Difference in Focus Ring

There is a characteristic difference according to the step difference in the focus ring. That is, in the application embodiment of the present invention, there is a characteristic difference between the higher side 101 and the lower side 102 in the focus ring 1000.

That is, there are the following characteristic differences.

In the case in which the focus ring includes two layers, the resistance value of the first layer is higher than that of the second layer (or vice versa). Meanwhile, in the case in which the focus ring includes two or more layers, the resistance value of the upper layer is higher than that of the lower layer (or vice versa).

In the case in which the focus ring includes two layers, the nitrogen concentration value of the first layer is higher than that of the second layer (or vice versa). Meanwhile, in the case in which the focus ring includes two or more layers, the nitrogen concentration value of the upper layer is higher than that of the lower layer (or vice versa).

In the case in which the focus ring includes two layers, the thermal conductivity of the first layer is higher than that of the second layer (or vice versa). Meanwhile, in the case in which the focus ring includes two or more layers, the thermal conductivity of the upper layer is higher than that of the lower layer (or vice versa).

In the case in which the focus ring includes two layers, the flexural strength of the first layer is higher than that of the second layer (or vice versa). Meanwhile, in the case in which the focus ring includes two or more layers, the flexural strength of the upper layer is higher than that of the lower layer (or vice versa).

In the case in which the focus ring includes two layers, the flexural strength of the first layer is higher than that of the second layer (or vice versa). Meanwhile, in the case in which the focus ring includes two or more layers, the flexural strength of the upper layer is higher than that of the lower layer (or vice versa).

In the case in which the focus ring includes two layers, the 6H peak height of the first layer is higher than that of the second layer (or vice versa). Meanwhile, in the case in which the focus ring includes two or more layers, the 6H peak height is higher than that of the lower layer (or vice versa).

In the case in which the focus ring includes two layers, the impurity value of the first layer is the same as or similar to that of the second layer. Meanwhile, in the case in which the focus ring includes two or more layers, the impurity value of the upper layer is the same as or similar to that of the lower layer.

The invention claimed is:

1. A chemical-vapor-deposition silicon carbide (SIC) bulk having an improved etching characteristic, comprising:
   silicon carbide (SIC) manufactured by a chemical vapor deposition method using MTS (met yltrichlorosilane), hydrogen ($H_2$), and nitrogen ($N_2$) gases,
   wherein the SIC manufactured by the chemical vapor deposition method is β-SiC (3C-SiC), 6H-SiC is present in the SIC manufactured by the chemical vapor deposition method, five peaks having a reference code of 03-065-0360 and at least one peak having a reference code of 00-049-1428 are confirmed to be present from XRD analysis of the silicon carbide bulk, and a nitrogen concentration value is $4.0 \times 10^{18}$ atoms/cm$^3$ or more at a depth of 1,500 nm or more from a surface of the bulk, which is a metastable layer,
   wherein comb patterns are formed in grains of the carbide bulk,
   wherein an area ratio of comb patterns in grains of the bulk is 50% or more.

2. A chemical-vapor-deposition silicon carbide (SIC) bulk having an improved etching characteristic, comprising:
   silicon carbide (SIC) manufactured by a chemical vapor deposition method using MTS (methyltrichlorosilane), hydrogen ($H_2$), and nitrogen ($N_2$) gases,
   wherein the SIC manufactured by the chemical vapor deposition method is β-SiC (3C-SiC), 6H-SiC is present in the SIC manufactured by the chemical vapor deposition method, five peaks having a reference code of 03-065-0360 and at least one peak having a reference code of 00-049-1428 are confirmed to be present from XRD analysis of the silicon carbide bulk, and a resistance value of the silicon carbide is 0.3 Ω or less,
   wherein grains are present in the carbide bulk and comb patterns are formed in the grains,
   wherein an average grain size is about 40 to 100 μm.

3. A chemical-vapor-deposition silicon carbide (SIC) bulk having an improved etching characteristic, comprising:
   silicon carbide (SIC) manufactured by a chemical vapor deposition method using MTS (methyltrichlorosilane), hydrogen ($H_2$), and nitrogen ($N_2$) gases,
   wherein the SIC manufactured by the chemical vapor deposition method is β-SiC (3C-SiC), 6H-SiC is present in the SIC manufactured by the chemical vapor deposition method, five peaks having a reference code of 03-065-0360 and at least one peak having a reference code of 00-049-1428 are confirmed to be present from XRD analysis of the silicon carbide bulk, and a resistance value of the silicon carbide is 1 Ω or less,
   wherein an average grain size is about 40 to 100 μm when crystal grains are generated.

* * * * *